US012802763B2

(12) United States Patent
No et al.

(10) Patent No.: US 12,802,763 B2
(45) Date of Patent: Nov. 17, 2026

(54) MEMORY CONTROLLER, MEMORY SYSTEM INCLUDING MEMORY CONTROLLER, AND METHOD OF OPERATING MEMORY CONTROLLER

(71) Applicant: SAMSUNG ELECTRONICS CO., LTD., Suwon-si (KR)

(72) Inventors: Haedong No, Suwon-si (KR); Youjin Jeon, Suwon-si (KR); Minjin Jo, Suwon-si (KR); Younsoo Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 30 days.

(21) Appl. No.: 18/974,183

(22) Filed: Dec. 9, 2024

(65) Prior Publication Data

US 2025/0226036 A1 Jul. 10, 2025

(30) Foreign Application Priority Data

Jan. 9, 2024 (KR) ........................ 10-2024-0003641

(51) Int. Cl.
*G11C 16/26* (2006.01)
*G11C 16/04* (2006.01)

(52) U.S. Cl.
CPC .......... *G11C 16/26* (2013.01); *G11C 16/0483* (2013.01)

(58) Field of Classification Search
CPC . G11C 16/26; G11C 16/0483; G11C 11/5642; G11C 16/08; G11C 16/24; G11C 16/3404; G06F 3/0658; G06F 3/0679
See application file for complete search history.

(56) References Cited

U.S. PATENT DOCUMENTS

| | | | | |
|---|---|---|---|---|
| 9,111,626 | B2 | 8/2015 | Kim et al. | |
| 11,579,972 | B2 | 2/2023 | Shin et al. | |
| 2014/0269052 | A1 | 9/2014 | Dusija et al. | |
| 2018/0012663 | A1 | 1/2018 | Alhussien et al. | |
| 2020/0075118 | A1 | 3/2020 | Chew et al. | |
| 2022/0172785 | A1* | 6/2022 | Yoo | G11C 11/5671 |
| 2022/0222138 | A1* | 7/2022 | Park | G11C 29/021 |
| 2023/0036490 | A1 | 2/2023 | Wang et al. | |
| 2023/0298677 | A1 | 9/2023 | Jo et al. | |
| 2024/0272808 | A1 | 8/2024 | No et al. | |

FOREIGN PATENT DOCUMENTS

| | | | |
|---|---|---|---|
| KR | 10-2038408 | B1 | 10/2019 |
| KR | 10-2022-0103227 | A | 7/2022 |
| KR | 10-2023-0116566 | A | 8/2023 |

* cited by examiner

*Primary Examiner* — Francisco A Grullon
(74) *Attorney, Agent, or Firm* — Sughrue Mion, PLLC

(57) ABSTRACT

A memory controller includes a valley search manager configured to perform a valley search operation to search for a valley between threshold voltage distributions associated with the plurality of memory cells and obtain a valley read level corresponding to the valley, and a read level generator configured to model a cumulative cell count function between the threshold voltage distributions based on a plurality of read levels, generate a cumulative read level between the threshold voltage distributions based on the cumulative cell count function, and generate an optimal read level based on the valley read level and the cumulative read level.

20 Claims, 16 Drawing Sheets

MEMORY CONTROLLER, MEMORY SYSTEM INCLUDING MEMORY CONTROLLER, AND METHOD OF OPERATING MEMORY CONTROLLER

CROSS-REFERENCE TO RELATED APPLICATION

This application is based on and claims priority under 35 U.S.C. § 119 to Korean Patent Application No. 10-2024-0003641, filed on Jan. 9, 2024, in the Korean Intellectual Property Office, the disclosure of which is incorporated by reference herein in its entirety.

BACKGROUND

The disclosure relates to a memory controller and a memory system including the same, and more specifically, to a memory controller that generates an optimal read level using a valley read level and an cumulative read level.

Flash memory is a non-volatile memory that may retain stored data even when the power is turned off. Storage devices including flash memory, such as solid state drives (SSDs) and memory cards are widely used, and the storage devices are useful for storing or moving large amounts of data.

As the data storage capacity of flash memory increases and the number of bits stored per each memory cell increases, the margin between multiple threshold voltage distributions may decrease. Accordingly, in order to minimize errors in the data read process, an optimal read level that may determine multiple threshold voltage distributions needs to be calculated.

To calculate the optimal read level, a valley search operation may be performed on the threshold voltage distribution of memory cells. Memory cells may deteriorate for various reasons, such as repeated program/erase operations on memory cells or exposure to high temperatures for a long period of time. When deterioration occurs in the memory cell, an error may occur when performing a read operation at the valley read level found through the valley search operation.

Accordingly, technology is required to generate an optimal read level to minimize errors.

SUMMARY

Embodiments provide a memory controller to improve reliability when performing a data read operation using an optimal read level by generating the optimal read level using the valley read level and cumulative read level obtained by performing a valley search operation.

According to an aspect of the disclosure, a memory controller configured to control a memory device including a plurality of memory cells, includes: a valley search manager configured to perform a valley search operation to search for a valley between threshold voltage distributions associated with the plurality of memory cells and obtain a valley read level corresponding to the valley; and a read level generator configured to model a cumulative cell count function between the threshold voltage distributions based on a plurality of read levels, generate a cumulative read level between the threshold voltage distributions based on the cumulative cell count function, and generate an optimal read level based on the valley read level and the cumulative read level.

According to an aspect of the disclosure, a method of operating a memory controller, includes: performing a valley search operation that searches for a valley between threshold voltage distributions associated with a plurality of memory cells to obtain a plurality of read points including a plurality of read levels and cumulative cell count values respectively corresponding to the plurality of read levels; generating a valley read level corresponding to the valley based on the plurality of read points; modeling a cumulative cell count function between the threshold voltage distributions based on the plurality of read points and generating a cumulative read level between the threshold voltage distributions based on the cumulative cell count function; and generating an optimal read level by applying a valley weight to the valley read level and applying a cumulative weight to the cumulative read level.

According to an aspect of the disclosure, a memory system includes: a memory device; and a memory controller, wherein the memory device is configured to, during a valley search operation that searches for a valley between threshold voltage distributions associated with a plurality of memory cells, generate cumulative cell count values respectively corresponding to a plurality of read levels, and wherein the memory controller is configured to: receive the cumulative cell count values and generates a valley read level corresponding to the valley based on the cumulative cell count values, model a cumulative cell count function that takes the plurality of read levels as input and outputs the cumulative cell count values respectively corresponding to the plurality of read levels, generate a cumulative read level based on the cumulative cell count function, and generate an optimal read level based on the valley read level and the cumulative read level.

BRIEF DESCRIPTION OF THE DRAWINGS

The above and/or other aspects will be more clearly understood from the following detailed description taken in conjunction with the accompanying drawings, in which.

DETAILED DESCRIPTION

Figure 1:
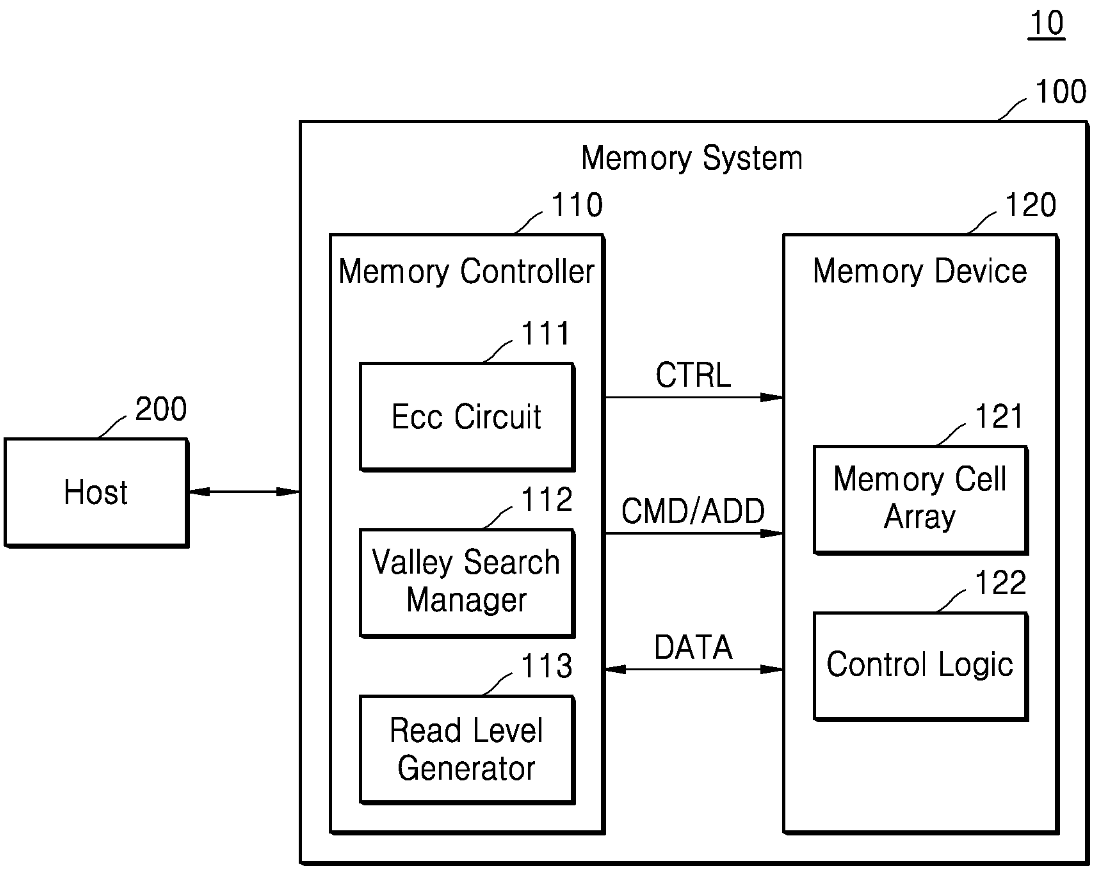
FIG. 1 is a block diagram illustrating a host-memory system according to an embodiment.

Hereinafter, example embodiments of the disclosure are described in detail with reference to the attached drawings. The same reference numerals are used for the same components in the drawings, and the descriptions already given for the same components are omitted.

FIG. 1 is a block diagram illustrating a host-memory system according to an embodiment.

Referring to FIG. 1, a host-memory system 10 may include a host 200 and a memory system 100. Additionally, the memory system 100 may include a memory controller 110 and a memory device 120.

The host 200 may communicate with the memory system 100 through an interface. Here, the interface may be implemented with, for example, non-volatile memory express (NVMe), non-volatile memory express management interface (NVMe MI), or NVMe over fabric (NVMeof).

The host 200 may provide the memory system 100 with a write request requesting to store data in the memory system 100. Additionally, the host 200 may provide the memory system 100 with a logical address and data for identifying data. In one embodiment, a logical address may be included in the write request.

The host 200 may provide the memory system 100 with a read request requesting the memory system 100 to provide data stored in the memory system 100. Additionally, the host 200 may provide the memory system 100 with a logical address for identifying data. In one embodiment, a logical address may be included in the read request.

The memory system 100 may include the memory controller 110 and the memory device 120. The memory controller 110 and the memory device 120 may be integrated into one semiconductor device. As an example, the memory controller 110 and the memory device 120 may be integrated into one semiconductor device. For example, the memory system 100 may be implemented as an internal memory built into an electronic device and may be an embedded universal flash storage (UFS) memory device, an embedded multimedia card (eMMC), or an SSD. In some embodiments, the memory system 100 may be implemented as an external memory that is removable from an electronic device and may be, for example, a UFS memory card, a compact flash (CF) memory card, a secure digital (SD) memory card, a micro secure digital (micro-SD) memory card, a mini secure digital (Mini-SD) memory card, an extreme digital (xD) memory card, or a memory stick.

The memory controller 110 may control the memory device 120 to read data stored in the memory device 120 or write data to (or program) the memory device 120 in response to a request (for example, a write request or a read request) provided from the host 200. In detail, the memory controller 110 may control write operations (or program operations), read operations, and erase operations for the memory device 120 by providing commands/addresses CMD/ADD and control signals CTRL to the memory device 120. In addition, data to be written DATA and data to be read DATA may be transmitted and received between the memory controller 110 and the memory device 120.

The memory controller 110 may communicate with the host 200 through various standard interfaces. For example, the memory controller 110 may include an interface circuit, and the interface circuit may provide various standard interfaces between the host 200 and the memory controller 110. The standard interface may include various interface methods, such as advanced technology attachment (ATA), serial ATA (SATA), external SATA (e-SATA), small computer small interface (SCSI), serial attached SCSI (SAS), peripheral component interconnection (PCI), PCI express (PCI-e), IEEE 1394, universal serial bus (USB), SD card, multimedia card (MMC), embedded multimedia card (eMMC), UFS, and CF card interfaces.

The memory controller 110 may include an error correction code (ECC) circuit 111, a valley search manager 112, and a read level generator 113.

The ECC circuit 111 may be configured to detect errors in data read from the memory device 120 and correct the detected errors using an error correction code. The ECC circuit 111 may include any circuit, system, or device for error correction. When the ECC circuit 111 performs error correction, in a case where the number of error bits is greater than the correction threshold, error correction may fail. In an embodiment, based on whether the ECC circuit 111 succeeds in error correction, the valley search manager 112 and/or the read level generator 113 may perform an operation to generate an optimal read level. For example, the valley search manager 112 may generate a valley read level based on whether the ECC circuit 111 succeeds in error correction. Based on whether the ECC circuit 111 succeeds in error correction, the read level generator 113 may obtain a cumulative read level and generate the optimal read level based on the cumulative read level.

The valley search manager 112 may perform a valley search operation. In detail, the valley search manager 112 may control the memory device 120 to perform the valley search operation on the memory device 120. The valley search operation may be an operation that searches for a valley between threshold voltage distributions of memory cells included in the memory device 120. As an example, the valley search operation may be an operation of searching for a valley formed at a point where the threshold voltage distribution of the first state intersects with a threshold voltage distribution of the second state among a plurality of states representing values stored in memory cells in the threshold voltage distribution. The second state may be adjacent to the first state and have a threshold voltage level higher than the threshold voltage level of the first state.

The valley search manager 112 may obtain the valley read level corresponding to the valley through the valley search operation. The valley read level corresponding to the valley may mean the threshold voltage value of the valley in the threshold voltage distribution. The cell count value corresponding to the valley may mean the number of memory cells corresponding to the valley read level.

The valley search manager 112 may generate the valley read level based on a plurality of read points. The plurality of read points may include a plurality of read levels and cumulative cell count values respectively corresponding to the plurality of read levels. In detail, the valley search manager 112 may model a cell count function, based on the plurality of read levels and the cumulative cell count values corresponding to the plurality of read levels, search for a valley based on the modeled valley cell count function, and calculate the valley read level corresponding to the valley.

The cumulative cell count value may be a value that sequentially accumulates the number of memory cells corresponding to each of the plurality of read levels. The cumulative cell count value may be obtained by performing a counting operation (e.g., on cell or off cell counting) on read data read using the plurality of read levels through the valley search operation. For example, the first cumulative cell count value may be a value obtained by counting on cells (or off cells) at the first read level and the second cumulative cell count value may be a value obtained by counting on cells (or off cells) at the second read level. As an example, the valley search manager 112 may obtain a plurality of read points from memory device 120. However, the valley search manager 112 is not necessarily limited thereto, and the memory controller 110 may obtain the plurality of read points through a valley search operation.

The valley search manager 112 may perform the valley search operation for a plurality of states in the threshold voltage distribution and obtain a valley read voltage corresponding to each state. The valley search manager 112 may find valleys for two adjacent states. A valley formed by one state among the plurality of states and a state adjacent to the one state may be referred to as a valley corresponding to one state. For example, the valley corresponding to the first state may mean a first valley formed by a first state and a second state adjacent to the first state, and the valley read voltage corresponding to the first state may mean a read voltage corresponding to the first valley. The valley search manager 112 may obtain the valley read level corresponding to each valley.

The read level generator 113 may manage or adjust read levels (or read voltages). The read level may be a voltage applied to the word line to read data stored in programmed memory cells. For example, the read level generator 113 may adjust the read level used in the memory device 120 when error correction by the ECC circuit 111 fails for the read data. The read level generator 113 may adjust the read level used in the memory device 120 to generate an optimal read level.

The read level generator 113 may be configured to determine an optimal read level. An optimal read level voltage may also be referred to as the optimal read level. The optimal read level may refer to a voltage level at which the lowest number of error bits occurs when performing a read operation among threshold voltage levels. By referring to the threshold voltage distribution corresponding to the memory cells included in the memory device 120, the threshold voltage distribution of the ideal memory cells may form a symmetrical distribution. However, the memory cells may deteriorate over time. The memory cells may deteriorate due to various factors. For example, the various factors may include charge leakage, read disturb, program disturb, coupling between adjacent memory cells, temperature change, voltage change, and deterioration of memory cells due to repeated programming and erasing.

As deterioration occurs in memory cells, the threshold voltage distribution corresponding to the deteriorated memory cells may form an asymmetric distribution. Due to the asymmetry of the threshold voltage distribution, an error may occur even if a read operation is performed depending on the valley read level corresponding to the valley derived through the valley search operation. Therefore, it is necessary to generate an optimal read level that causes fewer errors by using the valley read level calculated through the valley search operation.

The read level generator 113 may generate the optimal read level, based on the valley read level and the cumulative read level. The read level generator 113 may receive the valley read level from the valley search manager 112. The read level generator 113 may generate the cumulative read level, based on the plurality of read levels and the cumulative cell count values corresponding to the plurality of read levels. As an example, the read level may also be referred to as a read voltage level.

The read level generator 113 may model a cumulative cell count function between threshold voltage distributions based on the plurality of read levels and the cumulative cell count values corresponding to the plurality of read levels. The cumulative cell count function may be a function representing cumulative cell count values corresponding to a plurality of threshold voltages.

In one embodiment, the read level generator 113 may model a cumulative cell count function using a plurality of read points obtained through the valley search operation. As an example, the read level generator 113 may receive the plurality of read points from memory device 120, or may receive the plurality of read points from another component of the memory controller 110 (e.g., the valley search manager 112 or counting logic). By modeling the cumulative cell count function using the plurality of read points obtained through the valley search operation, the cumulative cell count function may be modeled without additional components. Accordingly, the production cost of memory may be reduced and the degree of freedom in memory design may be increased.

The read level generator 113 may generate the cumulative read level based on the cumulative cell count function. The read level generator 113 may generate a cumulative read level corresponding to an ideal cell count value based on the cumulative cell count function. The cumulative read level may be an input value of the cumulative cell count function when the ideal cell count value is the output of the cumulative cell count function.

In one embodiment, the ideal cell count value may be a value obtained by dividing the number of memory cells included in the memory device 120 equally into a plurality of states in the threshold voltage distribution. The ideal cell count value may mean the number of memory cells included in one state when a plurality of memory cells are uniformly divided into the plurality of states.

The read level generator 113 may generate the optimal read level, based on the valley read level and the cumulative read level. The read level generator 113 may generate the optimal read level by applying a valley weight to the valley read level and applying a cumulative weight to the cumulative read level. In one embodiment, the valley weight and the cumulative weight are positive numbers, and the cumulative weight may be larger than the valley weight. As an example, the cumulative weight may be twice the valley weight. However, it is not necessarily limited thereto.

The read level generator 113 may generate an optimal read level corresponding to the plurality of states in the threshold voltage distribution. The read level generator 113 may generate the optimal read level between two adjacent states among a plurality of states. The optimal read level corresponding to a specific state may mean the optimal read level between a specific state and a state adjacent to the specific state. For example, in the threshold voltage distribution, when the first state and the second state correspond to states adjacent to each other, the optimal read level corresponding to the first state may mean the optimal read level between the first state and the second state. When the second state and the third state correspond to adjacent states, the optimal read level corresponding to the second state may mean the optimal read level between the second state and the third state.

The memory controller 110 may control the memory device 120 so that the memory device 120 may perform the read operation depending on the optimal read level. The memory controller 110 may provide information related to the optimal read level to the memory device 120 so that data may be read from the memory device 120. For example, the memory controller 110 may provide a control signal CTRL for controlling the read level based on the optimal read level to the memory device 120, or information related to the optimal read level may be provided to the memory device 120. The memory device 120 may generate an internal control signal to control the level of the read voltage based on the control signal CTRL or the information related to the optimal read level The valley search manager 112 and/or the read level generator 113 may be implemented as hardware or software, or as a combination of hardware and software. As an example, the valley search manager 112 and/or the read level generator 113 may be implemented as firmware or software for generating the optimal read level, or may be implemented as hardware capable of performing a series of operations. As an example, when the valley search manager 112 and/or the read level generator 113 are implemented in software including firmware, the memory controller 110 may include a memory that stores software and the valley search manager 112 and/or the read level generator 113 may be loaded into the memory as software and executed by a processor.

The memory device 120 may include a non-volatile memory device, such as flash memory. The flash memory may include a 2D NAND memory array or a 3D (or vertical) NAND (VNAND) memory array. In one embodiment, the 3D memory array may include vertical NAND strings arranged in a vertical direction such that at least one memory cell is located on top of other memory cells. The at least one memory cell may include a charge trap layer.

However, embodiments are not limited thereto, and the memory device 120 may include other types of memories. For example, the memory device 120 may include non-volatile memory, and the non-volatile memory may be of various types, such as magnetic RAM (MRAM), spin-transfer torque MRAM, conductive bridging RAM (CBRAM), ferroelectric RAM (FeRAM), phase RAM (PRAM), resistive RAM, nanotube RAM, polymer RAM (PoRAM), nano floating gate memory (NFGM), holographic memory, molecular electronics memory, or insulator resistance change memory. Hereinafter, embodiments are described assuming that the memory device 120 is a flash memory device.

The memory device 120 may include a memory cell array 121 and a control logic 122. The memory cell array 121 may include a plurality of memory blocks. Each memory block may include a plurality of memory cells arranged in areas where a plurality of word lines intersect with a plurality of bit lines. The plurality of memory cells may have multiple threshold voltage distributions depending on programmed data. For example, when the memory cell is a single level cell (SLC) that stores one bit per memory cell, the memory cells may have two threshold voltage distributions depending on a program state. In another example, when the memory cell is a multi-level cell (MLC) that stores two bits per memory cell, the memory cells may have four threshold voltage distributions depending on the program state. In another example, in addition, when the memory cell is a triple level cell (TLC) that stores 3 bits per memory cell, the memory cells may have 8 threshold voltage distributions depending on the program state. As such, when memory cells store 4 or more bits per memory cell, the memory cells may have 16 or more threshold voltage distributions depending on the program state. One threshold voltage distribution may correspond to a specific state of a memory cell.

The control logic 122 may control the overall operation of the memory device 120. As an example, the control logic 122 may generate a plurality of read points through a valley search operation. The control logic 122 may transmit the plurality of read points to the memory controller 110.

The memory controller 110 may model the cumulative cell count function using the cumulative cell count value and generate an optimal read level by applying weights to each of the cumulative read level and valley read level obtained based on the cumulative cell count function, thereby reducing errors in read data. Accordingly, reliability may be improved when performing the data read operation.

Figure 2:
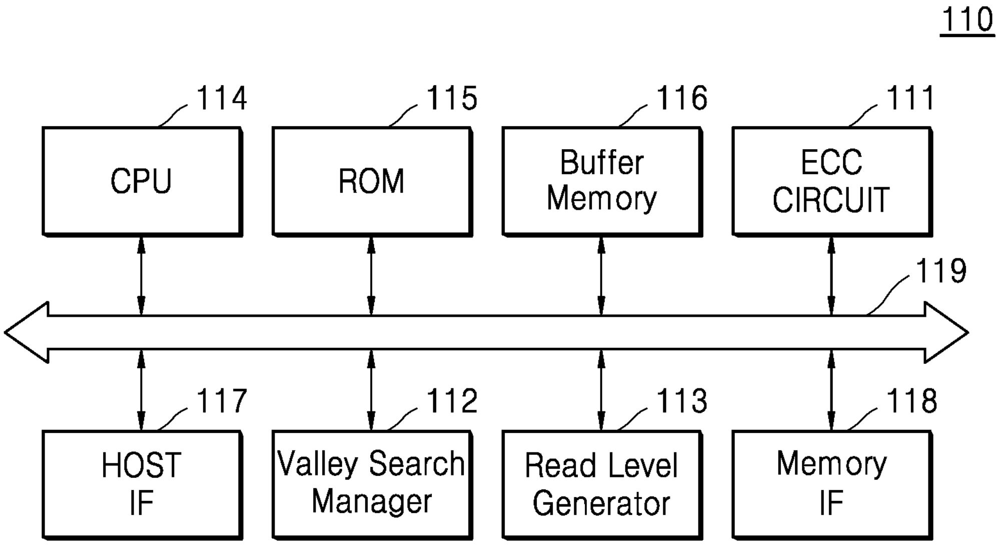
FIG. 2 is a block diagram to explain a memory controller according to an embodiment.

FIG. 2 is a block diagram to explain a memory controller according to an embodiment. Because a memory controller 110, a valley search manager 112, and a read level generator 113 shown in FIG. 2 correspond to the memory controller 110, valley search manager 112, and read level generator 113 shown in FIG. 1, descriptions already given of the memory controller 110, valley search manager 112, and read level generator 113 are omitted.

The memory controller 110 may include a central processing unit (CPU) 114, read-only memory (ROM) 115, a buffer memory 116, an ECC circuit 111, a host interface 117, a valley search manager 112, a read level generator 113, and a memory interface 118.

The CPU 114 may control the overall operation of the memory controller 110. In detail, the CPU 114 may receive a command from a host (e.g., the host 200 in FIG. 1) and control the memory controller 110 to perform an operation depending on the command. The CPU 114 may perform garbage collection, address mapping, wear leveling, etc. to manage memory devices (e.g., the memory device 120 in FIG. 1) by executing firmware loaded in the ROM 115 of the memory controller 110.

The ROM 115 may be ROM that stores programs executed by the CPU 114. The ROM 115 may store a program that implements an operating method of the memory controller 110 or firmware in which the program is recorded. The firmware may include three-layer structures, for example, a host interface layer (HIL), a flash translation layer (FTL), and a flash interface layer (FIL). In an embodiment, the firmware may be stored in a memory device.

In the buffer memory 116, software or firmware for operating the memory system 100 may be loaded from the ROM 115 or from a memory device. In addition, the buffer memory 116 may temporarily store data transmitted from the host, data generated by the CPU 114, and data read from a memory device. The buffer memory 116 may include at least one dynamic random access memory (DRAM) or static random access memory (SRAM). In an embodiment, the buffer memory 116 may be provided within the memory controller 110 but may also be placed outside the memory controller 110.

The ECC circuit 111 may perform error detection and correction functions on read data read from a memory device. In more detail, the ECC circuit 111 may generate parity bits for write data to be written to the memory device, and the parity bits generated in this way may be stored in the memory device along with the write data. When data is read data from a memory device, the ECC circuit 111 may correct errors in the read data using parity bits read from the memory device along with the read data and may output error-corrected read data. In an embodiment, when the number of bits in which an error occurs in the read data exceeds a limit that the ECC circuit 111 may correct, error correction may fail. In this case, the memory controller 110 may generate an optimal read level.

The read level generator 113 may determine whether to generate the optimal read level depending on whether error correction is successful in the ECC circuit 111. When error correction is successful, the read level generator 113 may not generate the optimal read level, based on the valley read level and the cumulative read level, as described above with reference to FIG. 1. The read level generator 113 may not model a cumulative cell count function based on a plurality of points and may not generate the cumulative read level. The read level generator 113 may control the memory device to perform the read operation at a pre-existing read level. As an example, the valley search manager 112 may also determine whether to generate the valley read level depending on whether error correction is successful in the ECC circuit 111. The valley search manager 112 may not perform the valley search operation when ECC error correction is successful.

When error correction fails, the read level generator 113 may generate the optimal read level. In addition, as an example, the valley search manager 112 may generate the valley read level through the valley search operation. The read level generator 113 may model the cumulative cell count function based on the plurality of read points generated through the valley search operation. The plurality of read points may include a plurality of read levels and cumulative cell count values respectively corresponding to the plurality of read levels. The read level generator 113 and valley search manager 112 may be implemented using hardware circuits and/or a processor executing instructions stored in a memory.

The read level generator 113 may model the cumulative cell count function of a cubic function. As an example, the read level generator 113 may model the cumulative cell count function of a cubic function based on a plurality of at least four read points. For example, the read level generator 113 may model the cumulative cell count function of a cubic function that takes four read levels as input and outputs four cumulative cell count values respectively corresponding to the four read levels.

The read level generator 113 may generate the cumulative read level based on the cumulative cell count function. The read level generator 113 may use the cumulative cell count function to obtain a cumulative read level corresponding to an ideal cell count value. The read level generator 113 may generate an optimal read level based on the valley read level and cumulative read level obtained through the valley search operation.

When performing the read operation, the voltage level at which the lowest number of error bits occurs in the threshold voltage distribution may be between the cumulative read level and the valley read level. Accordingly, the read level generator 113 may calculate the threshold voltage value between the cumulative read level and the valley read level as the optimal read level. The optimal read level may be closer to the cumulative read level than the valley read level. The read level generator 113 may generate the optimal read level by applying different weights to each of the valley read level and the cumulative read level. As an example, the read level generator 113 may generate the optimal read level by applying a greater weight to the cumulative read level than to the valley read level.

The host interface 117 may transmit and receive packets to and from the host. Packets transmitted from the host to the host interface 117 may include commands or data to be written to a memory device, and packets transmitted from the host interface 117 to the host may include a response to a command or data read from memory.

The memory interface 118 may transmit, to the memory device, data to be written to the memory device or receive data read from the memory device. The memory interface 118 may be implemented to comply with standard protocols such as toggle or open NAND flash interface (ONFI). In an embodiment, components of the memory controller 110 may communicate with each other via a bus 119.

Figure 3:
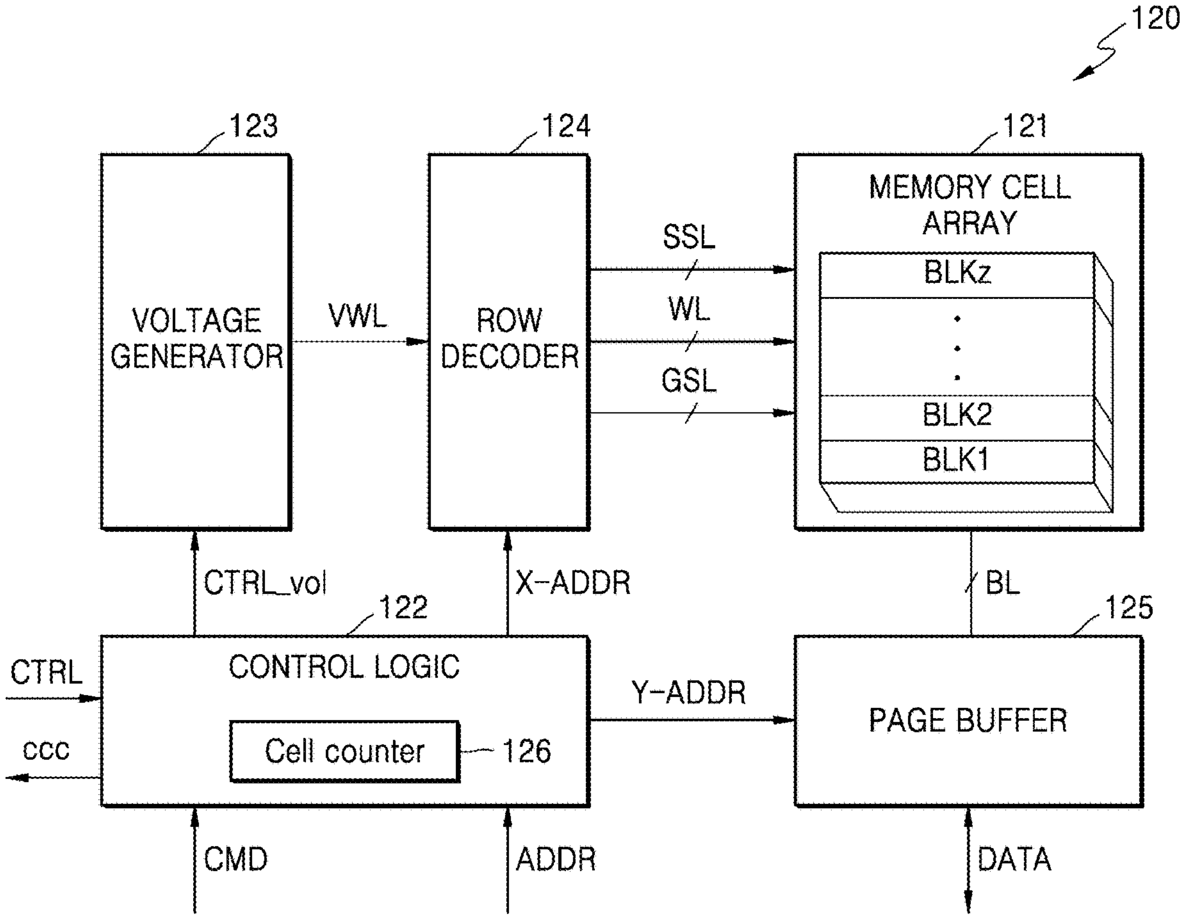
FIG. 3 is a diagram to explain a memory device according to an embodiment.

FIG. 3 is a diagram to explain a memory device according to an embodiment.

Referring to FIG. 3, the memory device 120 may include a memory cell array 121, a control logic 122, voltage generator 123, a row decoder 124, and a page buffer 125.

The memory cell array 121 may include a plurality of memory cells and may be connected to word lines WL, string selection lines SSL, ground selection lines GSL, and a plurality of bit lines BL. In detail, the memory cell array 121 may be connected to the row decoder 124 through the word lines WL, the string select lines SSL, and the ground select lines GSL and may be connected to the page buffer 125 through the plurality of bit lines BL.

The memory cell array 121 may include a plurality of memory blocks BLK1 to BLKz (z is a positive integer). For example, each of the memory blocks BLK1 to BLKz may include a plurality of memory cells. Each of the plurality of memory blocks BLK1 to BLKz may have a three-dimensional structure (or vertical structure). The plurality of memory blocks BLK1 to BLKz may be selected by the row decoder 124. For example, the row decoder 124 may select a memory block corresponding to a block address from among the plurality of memory blocks BLK1 to BLKz.

Each of the memory cells included in the memory cell array 121 may store at least one bit. For example, the memory cell may be an SLC that stores 1 bit of data. In another example, the memory cell may be an MLC that stores 2 bits of data. In another example, the memory cell may be a TLC that stores 3 bits of data. In another example, the memory cell may be a quad level cell (or quadruple level cell, QLC) that stores 4-bit data. However, embodiments are not limited thereto. For example, among the plurality of memory blocks BLK1 to BLKz included in the memory cell array 121, some of the memory blocks may be SLC blocks. And other memory blocks may be MLC blocks or TLC blocks.

When an erase voltage is applied to the memory cell array 121, a plurality of memory cells may be in an erase state, and when a program voltage is applied to the memory cell array 121, a plurality of memory cells may be in the program state. In this case, each memory cell may have the erase state or at least one program state classified based on a threshold voltage. That is, states of memory cells may include the erase state and the at least one program state, and a specific state of each memory cell may be the erase state or a specific program state.

The control logic 122 may generally control various operations of the memory device 120. For example, the control logic 122 may output various control signals for writing data to or read data from the memory cell array 121 based on the command CMD, address ADDR, and control signal CTRL.

The various control signals output from the control logic 122 may be provided to the voltage generator 123, the row decoder 124, and the page buffer 125. The control logic 122 may provide a voltage control signal CTRL_vol to the voltage generator 123. The control logic 122 may output the voltage control signal CTRL_vol so that multiple read operations are performed at different read levels to calculate the optimal read level, and the voltage generator 123 may generate a plurality of read voltages based on the voltage control signal CTRL_vol.

As an example, the control logic 122 may output the voltage control signal CTRL_vol so that the read level changes depending on a predetermined level interval, with one read level as the starting position. In addition, the control logic 122 may receive information related to the optimal read level calculated according to the embodiment described above and may control the voltage generator 123 so that data is read depending on the optimal read level. In an embodiment, the control logic 122 may output the voltage control signal CTRL_vol so that multiple read operations are performed at different read levels during a valley search operation.

In some embodiments, the control logic 122 may further include a cell counter 126. For example, a memory system may be implemented such that a cumulative cell count value ccc corresponding to a plurality of read levels is generated in the memory device 120 and provided to a memory controller (e.g., the memory controller 110 of FIG. 1). The cell counter 126 may count the number of memory cells corresponding to a specific threshold voltage range from data sensed by the page buffer 125. The cell counter 126 may generate the cumulative cell count value ccc indicating the number of memory cells. In one embodiment, memory cells that are counted may be referred to as off cells. In another embodiment, cells that are counted may be referred to as on cells. As an example, the cell counter 126 may generate the cumulative cell count value ccc corresponding to a plurality of read levels during a valley search operation. The cell counter may be implemented using hardware such as Boolean logic hardware and other hardware circuits such as flip-flops.

The voltage generator 123 may be connected to the memory cell array 121 through a plurality of word lines WL. The voltage generator 123 may generate various types of voltages to perform program operations, read operations, and erase operations on the memory cell array 121 based on the voltage control signal CTRL_vol. The voltage generator 123 may generate word line voltages VWL, for example, a program voltage, a verification voltage, a read voltage, an erase voltage, etc. During the read operation, the voltage generator 123 may generate the read voltage under the control by the control logic 122 and may provide the read voltage to the row decoder 124.

The row decoder 124 may select a specific word line from among the word lines WL in response to a row address X-ADDR received from the control logic 122. In detail, during the read operation, the row decoder 124 may provide a read voltage to the selected word line. In addition, the row decoder 124 may select some string selection lines from among the string selection lines SSL or some ground selection lines from among the ground selection lines GSL in response to the row address X-ADDR received from the control logic 122.

The page buffer 125 may be connected to the memory cell array 121 through the plurality of bit lines BL. The page buffer 125 may select some of the bit lines BL in response to the column address Y-ADDR received from the control logic 122. During the read operation, the page buffer 125 operates as a sense amplifier and may sense data stored in the selected memory cell through the selected bit line.

The page buffer 125 may temporarily store data DATA read from the memory cell array 121 or may temporarily store data DATA to be stored in the memory cell array 121.

The page buffer 125 may include a plurality of page buffers respectively connected to a plurality of bit lines BL. The plurality of page buffers may be arranged to correspond to each bit line, and each page buffer may include a plurality of latches. Hereinafter, the page buffer 125 is defined as including a page buffer connected to each bit line. However, in embodiments, the term may be defined differently, and as an example, one page buffer may be provided to correspond to a plurality of bit lines, and a structural unit disposed to correspond to each bit line may be defined as a page buffer unit.

Figure 4:
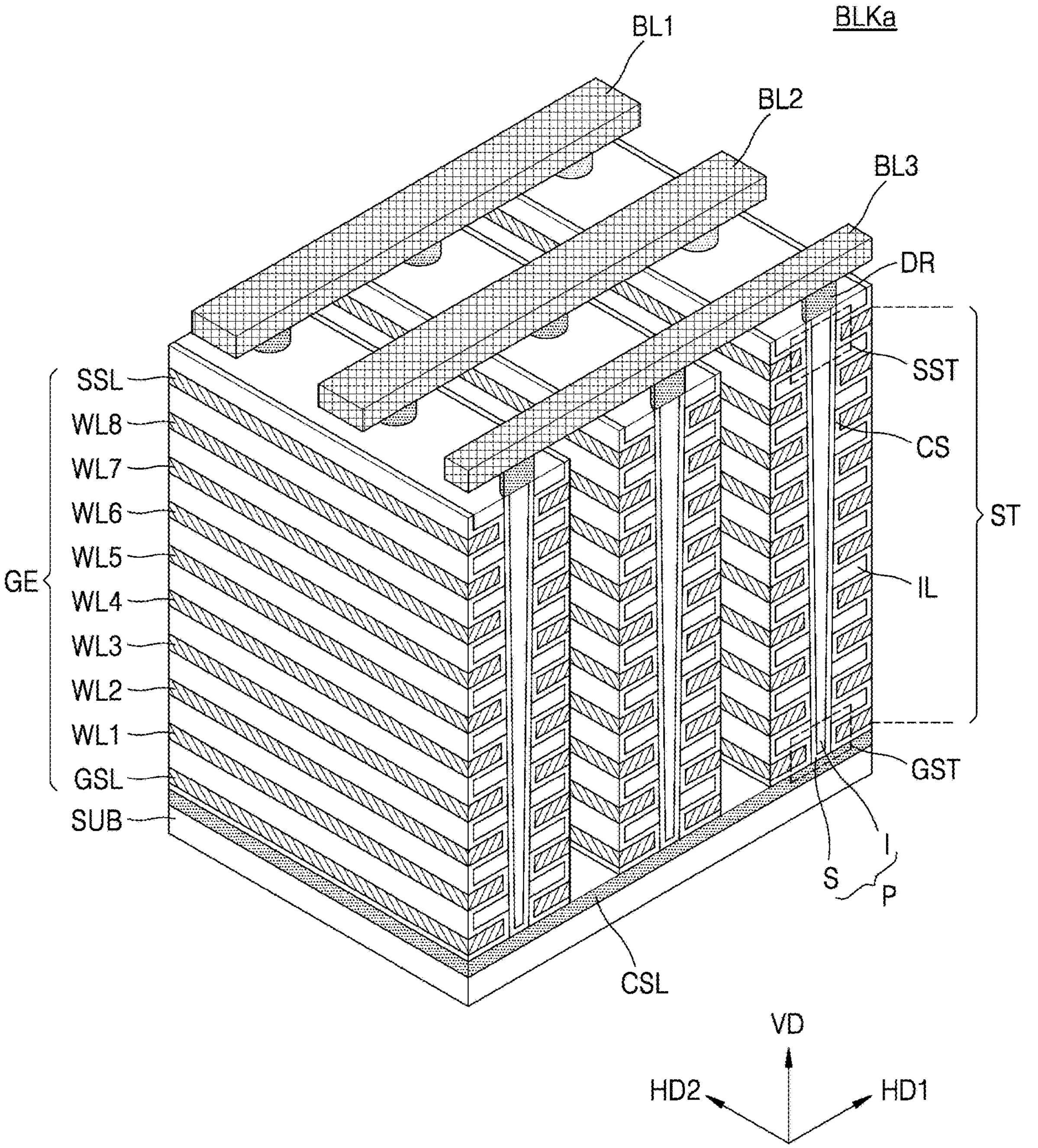
FIG. 4 is a perspective view showing a memory block according to an embodiment.

FIG. 4 is a perspective view showing a memory block according to an embodiment.

Referring to FIG. 4, a memory block BLKa may include a stack ST extending in a vertical direction VD on top of a substrate SUB. For example, the memory block BLKa may include a single stack ST between the substrate SUB and bit lines BL1 to BL3. Common source lines CSL may be disposed on the substrate SUB, insulating films IL extending in a second horizontal direction HD2 are sequentially provided in the vertical direction VD in the area of the substrate SUB between two adjacent common source lines CSL, and the insulating films IL are spaced apart by a certain distance in the vertical direction VD. Pillars P penetrating the insulating films IL in the vertical direction VD are provided in the area of the substrate SUB between two adjacent common source lines CSL. The pillar P may be referred to as a channel hole. The pillars P may be formed in a cup shape (or a closed-bottomed cylinder shape) extending in the vertical direction VD. A surface layer S of each pillar P may include a silicon material of a first type and may function as a channel region. In addition, an inner layer I of each pillar P may include an insulating material such as silicon oxide or an air gap.

In the area between two adjacent common source lines CSL, a charge storage layer CS is provided along the exposed surfaces of the insulating films IL, pillars P, and substrate SUB. The charge storage layer CS may include a gate insulating layer, a charge trap layer, and a blocking insulating layer. For example, the charge storage layer CS may have an oxide-nitride-oxide (ONO) structure. In addition, in the area between two adjacent common source lines CSL, gate electrodes GE such as select lines GSL and SSL and word lines WL1 to WL8 are provided on the exposed surface of the charge storage layer CS. Drains DR are provided on each of a plurality of pillars P. On the drains DR, bit lines BL1 to BL3 are provided, extending in a first horizontal direction HD1 and spaced apart by a specific distance in the second horizontal direction HD2.

Figure 5:
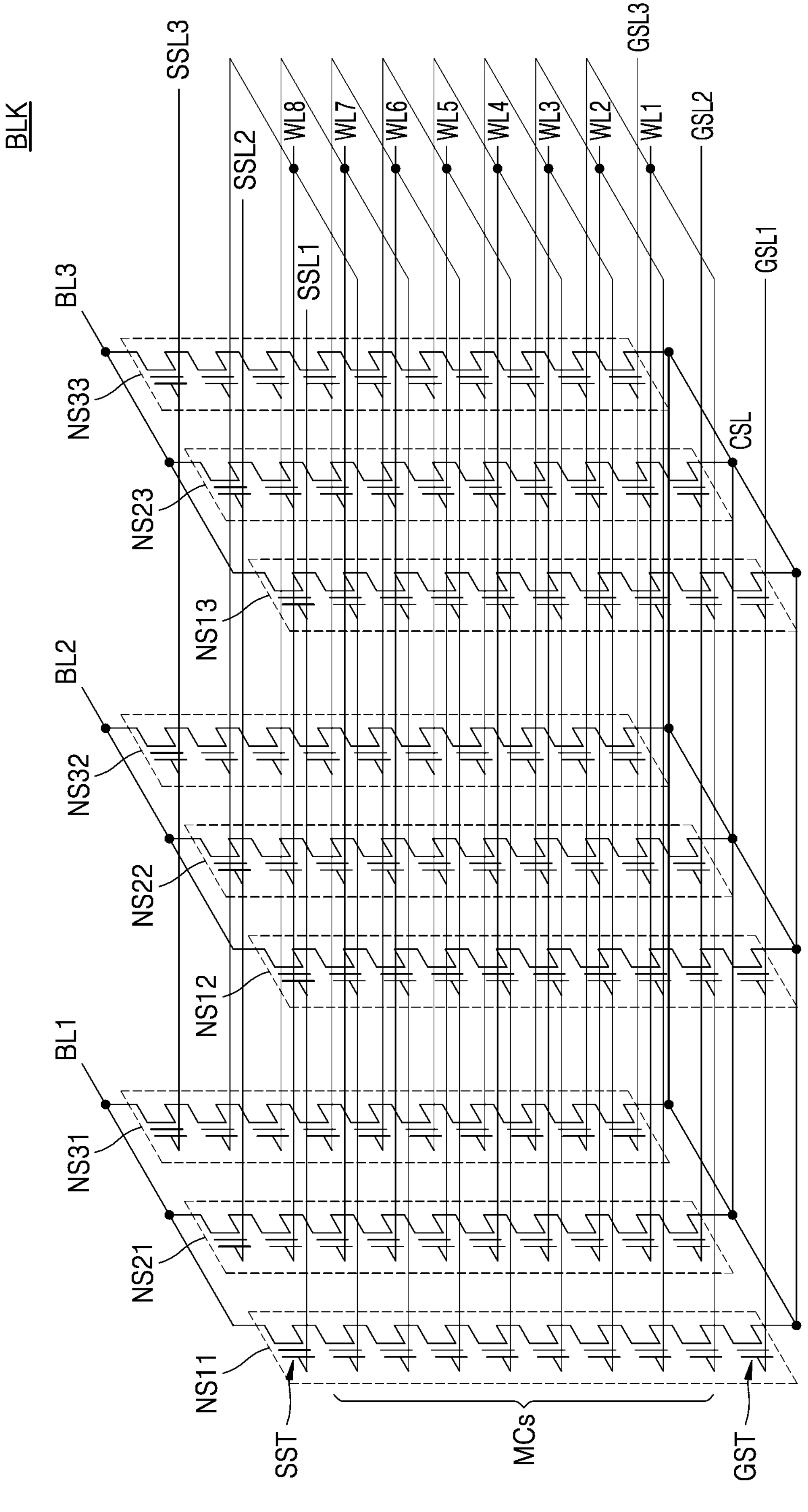
FIG. 5 is a circuit diagram showing a memory block according to an embodiment.

FIG. 5 is a circuit diagram showing a memory block according to an embodiment.

Referring to FIG. 5 a memory block BLK may include NAND strings NS11 to NS33, and each NAND string (e.g., NS11) may include a string select transistor SST, a plurality of memory cells MCs, and a ground select transistor GST connected in series. The string select transistor SST and the ground select transistor GST and memory cells MCs included in each NAND string may form a structure stacked in the vertical direction on a substrate.

The bit lines BL1 to BL3 may extend in a first direction, and the word lines WL1 to WL8 may extend in a second direction. NAND strings NS11, NS21, and NS31 may be located between the first bit line BL1 and the common source line CSL, NAND strings NS12, NS22, and NS32 may be located between the second bit line BL2 and the common source line CSL, and NAND strings NS13, NS23, and NS33 may be located between the third bit line BL3 and the common source line CSL.

The string select transistor SST may be connected to a corresponding string select line among the string select lines SSL1 to SSL3. Memory cells MCs may be respectively connected to corresponding word lines WL1 to WL8. The ground selection transistor GST may be connected to a corresponding ground selection line among the ground selection lines GSL1 to GSL3. The string select transistor SST may be connected to the corresponding bit line, and the ground select transistor GST may be connected to the common source line CSL. Here, the number of NAND strings, the number of word lines, the number of bit lines, the number of ground select lines, and the number of string select lines may vary depending on the embodiment.

Figure 6:
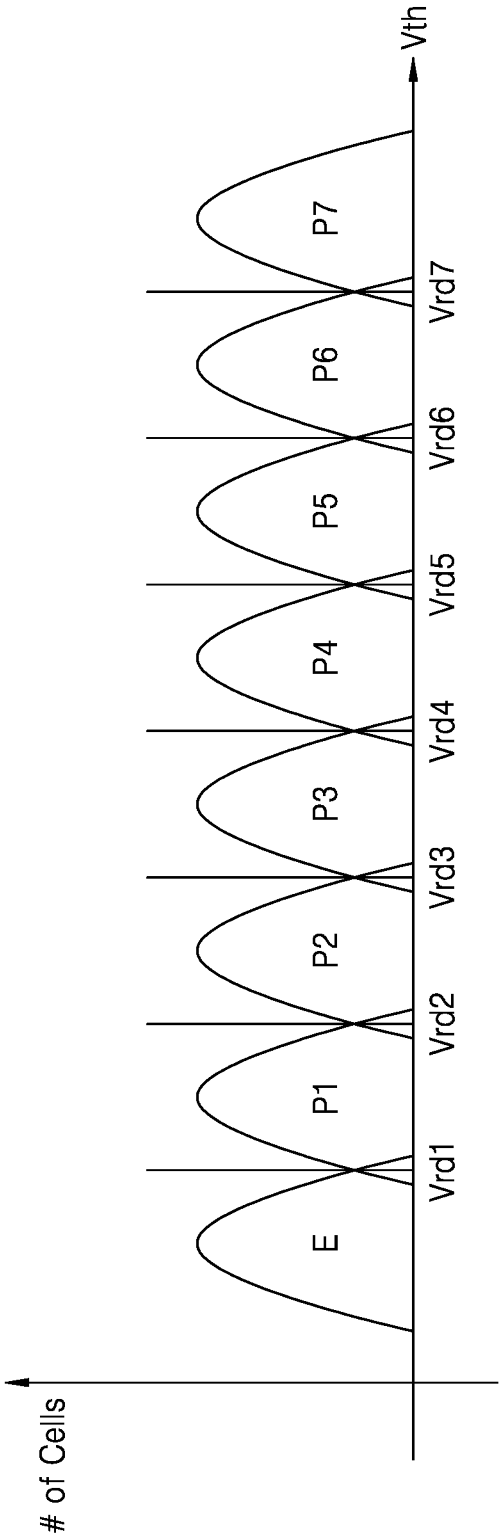
FIG. 6 is a diagram for explaining states of memory cells according to an embodiment.

FIG. 6 is a diagram to explain states of memory cells according to an embodiment.

Referring to FIG. 6, states E and P1 to P7 of a TLC are shown in FIG. 6. The embodiment shown in FIG. 6 is shown based on a TLC, but the embodiments are not limited thereto. The embodiments described below may also be applied to an SLC, which may have 2 states (e.g., E and P1), an MLC, which may have 4 states (e.g., E and P1~P3), and a QLC, which may have 16 states (e.g., E and P1 to P15). In the embodiments described below, it is assumed that the memory cell is a TLC.

In FIG. 6, the horizontal axis represents the threshold voltage Vth of a memory cell and the vertical axis represents the number of memory cells # of cells or memory cell count value corresponding to the threshold voltage Vth.

The TLC may have any one of eight states E and P1 to P7. For example, the TLC may have the erase state E. In another example, the TLC may have any one of seven program states P1 to P7.

In one embodiment, as shown in FIG. 6, the TLC may be programmed so that the areas of the threshold voltage distributions corresponding to each of the states E and P1 to P7 of the TLC are the same. The areas of the threshold voltage distributions corresponding to each of the TLC states E and P1 to P7 may be the same and have a symmetrical structure. The number of cells corresponding to each of the TLC states E and P1 to P7 may be equal to the ideal cell count value.

The first reference read level Vrd1 may have a voltage level between the erase state E and the first program state P1. The second reference read level Vrd2 may have a voltage level between the first program state P1 and the second program state P2. In this way, the ith read voltage (i is an integer of 3 or more) may have a voltage level between the i−1th program state and the ith program state.

When the first reference read level Vrd1 is applied to the selected word line, the memory cell with the erase state E becomes an on cell and memory cells having one of the first to seventh program states P1 to P7 become off cells. When the second reference read level Vrd2 is applied to the selected word line, the memory cell with the erase state E or the first program state P1 becomes an on cell and a memory cell having one of the second to seventh program states P2 to P7 becomes an off cell. In this way, when the i-th read voltage (i is an integer 3 or more) is applied to the selected word line, a memory cell with the erase state E or i−1 program state becomes an on cell and a memory cell having one of the i-th to j-th program states (j is an integer of i or more) becomes an off cell.

Figure 7A:
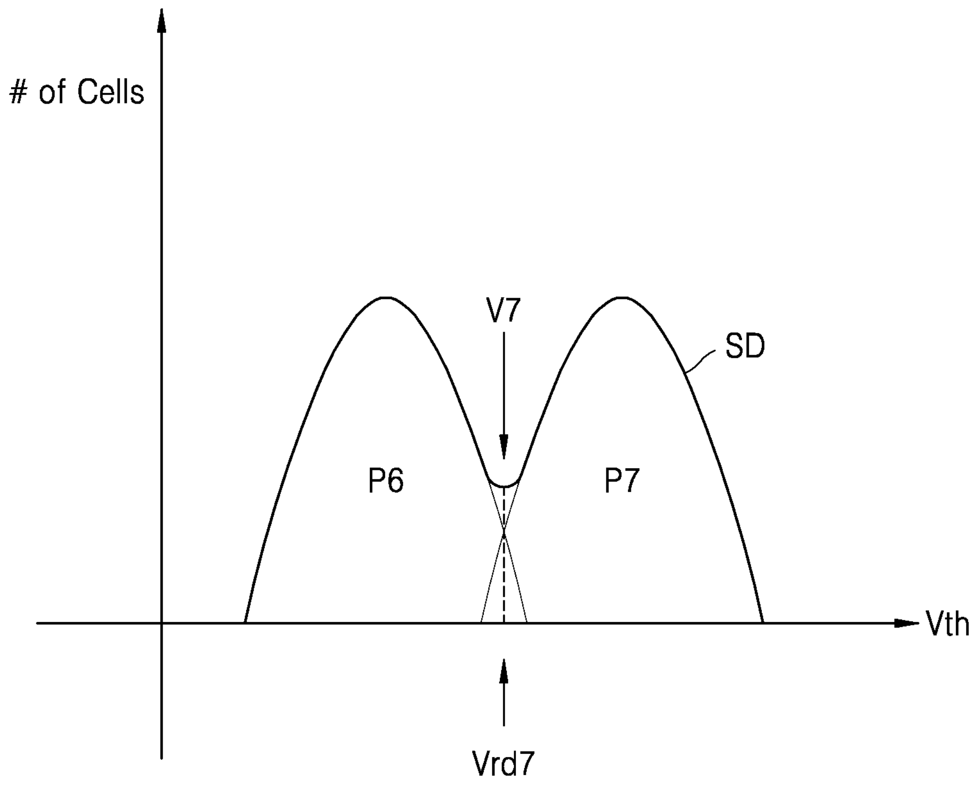
FIG. 7A is a diagram showing the distribution of threshold voltages of memory cells according to an embodiment.

FIG. 7A is a diagram showing the distribution of threshold voltages of memory cells according to an embodiment. In detail, FIG. 7A may show the threshold voltage distribution before deterioration occurs in memory cells. In the threshold voltage distribution shown in FIG. 7A, the horizontal axis may represent the threshold voltage Vth of the memory cells and the vertical axis may represent the number of memory cells # of cells or the memory cell count value corresponding to the threshold voltage Vth.

The threshold voltage distribution shown in FIG. 7A represents a portion of the threshold voltage distribution in FIG. 6 and may represent the distributions of two adjacent threshold voltages. For example, FIG. 7A may show threshold voltage distributions corresponding to the sixth program state P6 and the seventh program state P7. In FIG. 7A, the sixth program state P6 and the seventh program state P7 are shown for convenience of explanation, but this is only an example. The same or similar description as the sixth program state P6 and the seventh program state P7 may be applied to other states in the threshold voltage distributions.

In FIG. 7A, the threshold voltage distribution may form a symmetrical distribution because the memory cells are not deteriorated. The sixth program state P6 may be adjacent to the seventh program state P7, and the seventh valley V7 may be formed. The threshold voltage distributions of the sixth program state P6 and the seventh program state P7 may be symmetrical to each other. The threshold voltage distributions of the sixth program state P6 and the seventh program state P7 may be symmetrical with respect to the seventh valley V7. This may be applied equally or similarly to the other states E and P1 to P5 in FIG. 6.

Referring to FIG. 7A, a sum distribution SD may be the sum of the sixth program state P6 and the seventh program state P7. The sum distribution SD may be modeled as a probability density function, and a valley of the sum distribution SD may mean a portion of the probability density function corresponding to the sum distribution SD. For example, the sixth program state P6 may be adjacent to the seventh program state P7, and the seventh valley V7 may be formed as a valley of the sum distribution SD. Thus, the valley is associated with the memory cells which are exercised by an applied read voltage to a corresponding word line when determining the threshold voltage distributions of the sixth program state P6 and the seventh program state P7.

The threshold voltage corresponding to the valley of the sum distribution may be the valley read level. The valley read level of the seventh valley V7 of the sum distribution SD may be the seventh reference read level Vrd7. When the threshold voltage distribution of memory cells forms a symmetric distribution as shown in FIG. 7A, the threshold voltage level corresponding to this valley may be the optimal read level. That is, the seventh reference read level Vrd7 may match the optimal read level. However, when the threshold voltage distribution of memory cells does not form a symmetrical distribution, the threshold voltage level corresponding to the valley may not match the optimal read level. Hereinafter, a case where the threshold voltage distribution of memory cells is asymmetric is described with reference to FIG. 7B.

Figure 7B:
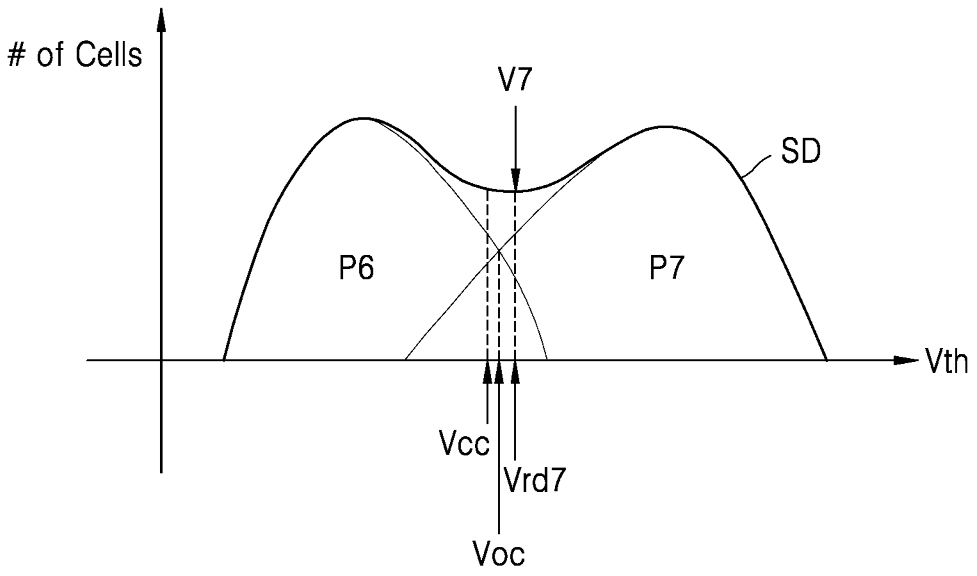
FIG. 7B is a diagram showing the distribution of threshold voltages of memory cells according to an embodiment.

FIG. 7B is a diagram showing the distribution of threshold voltages of memory cells according to an embodiment. In detail, FIG. 7B may show the threshold voltage distribution when deterioration occurs in memory cells. The descriptions already given regarding the distribution of threshold voltages of memory cells in FIG. 7B are omitted.

In FIG. 7B, the threshold voltage distribution may form an asymmetric distribution due to deterioration of memory cells. The sixth program state P6 may be adjacent to the seventh program state P7, and a seventh valley V7 may be formed. The threshold voltage distributions of the sixth program state P6 and the seventh program state P7 may be asymmetric to each other. This may be applied equally or similarly to other states E, P1 to P5 in FIG. 6.

Referring to FIG. 7B, the sum distribution SD may be the sum of the sixth program state P6 and the seventh program state P7. The sum distribution SD may be modeled as a probability density function, and the valley of the sum distribution SD may mean a portion of the probability density function corresponding to the sum distribution SD. The threshold voltage corresponding to the valley of the sum distribution SD may be the valley read level. The valley of the sum distribution SD may be the seventh valley V7, and the valley read level may be the seventh reference read level Vrd7.

When the threshold voltage distribution of memory cells forms an asymmetric distribution as shown in FIG. 7B, the threshold voltage level corresponding to the valley may not be the optimal read level. The valley read level may not be the optimal read level. That is, the seventh reference read level Vrd7 may not match the optimal read level Voc.

After data is written to a memory cell, disturbance degradation or retention degradation may occur in the memory cell. The disturbance degradation refers to a phenomenon in which the threshold voltages of memory cells change due to program, read, erase, coupling, etc. that occur around the memory cells. The retention deterioration refers to a phenomenon in which charges are trapped in a charge trapping layer of a memory cell and after the memory cell is programmed, the captured charges leak out over time and the threshold voltage of the memory cell changes. When deterioration occurs in the memory cell, the threshold voltage of the memory cell changes, so when data in the memory cell is read using initially set read levels, errors may be included in the read data.

When memory cells deteriorate, the threshold voltage distributions may change to be asymmetric as shown in FIG. 7B. For example, graphs representing the threshold voltage distribution of the sixth program state P6 and the threshold voltage distribution of the seventh program state P7 may be asymmetric to each other. The threshold voltage distribution area of the seventh program state P7 may be wider than the threshold voltage distribution area of the sixth program state P6.

When performing the read operation using the valley read level, errors may be included in the read data. For example, when performing the read operation using the seventh reference read level Vrd7, an error may be included in the read data. Therefore, when the threshold voltage distribution forms an asymmetric distribution, it is necessary to find the optimal read level Voc.

In FIG. 7B, the optimal read level Voc may be a threshold voltage value between the seventh reference read level Vrd7 and a cumulative read level Vcc. That is, the optimal read level Voc may be a threshold voltage between the valley read level and the cumulative read level Vcc. Therefore, the optimal read level Voc may be calculated using the valley read level and the cumulative read level Vcc. The cumulative read level Vcc is described below with reference to FIG. 10.

Figure 8:
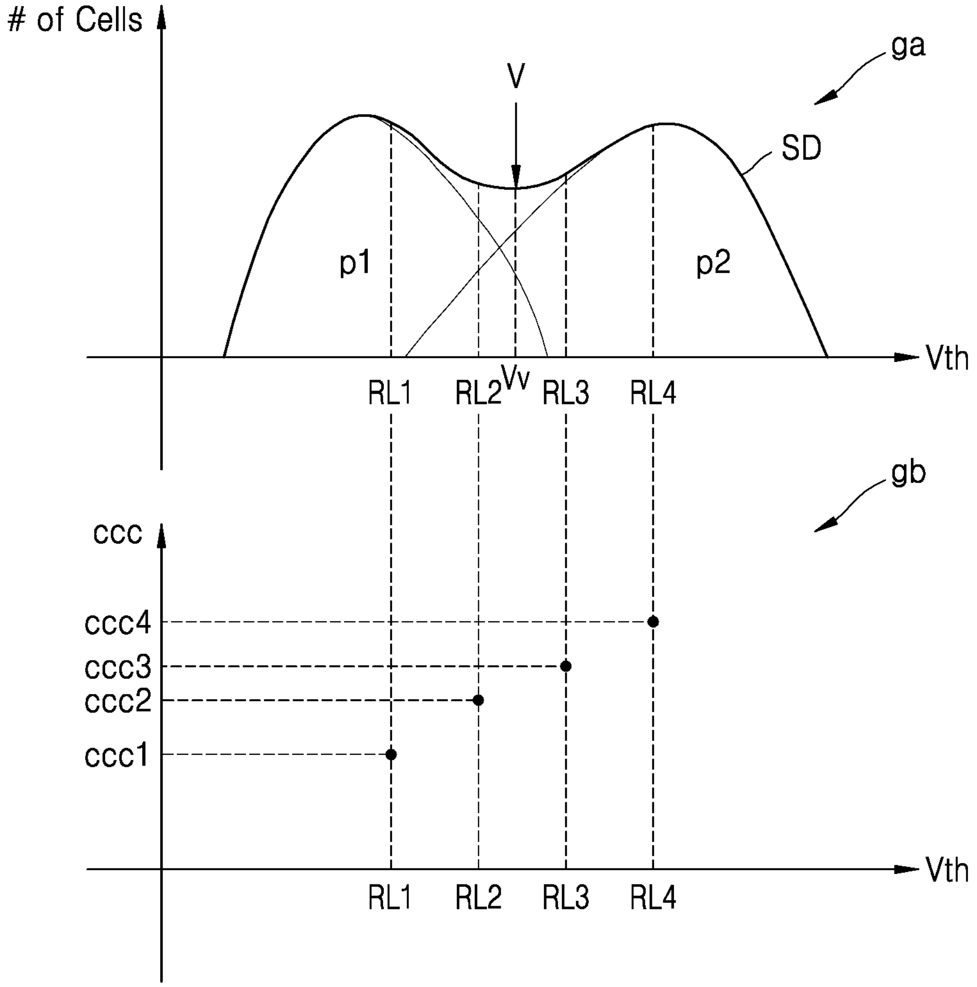
FIG. 8 is a diagram for explaining a cumulative cell count value according to an embodiment.

FIG. 8 is a diagram for explaining a cumulative cell count value according to an embodiment. The descriptions already given regarding the cumulative cell count value in FIG. 3 are omitted.

Referring to FIG. 8, a first graph ga may represent the sum distribution SD of two adjacent threshold voltage distributions among the threshold voltage distributions. The horizontal axis of the first graph ga may represent the threshold voltage Vth of memory cells, and the vertical axis of the first graph ga may represent the number # of cells of memory cells corresponding to the threshold voltage Vth. A second graph gb may represent the cumulative cell count value ccc of two adjacent threshold voltage distributions among the threshold voltage distributions. The horizontal axis of the second graph gb may represent the threshold voltage Vth of the memory cells, and the vertical axis of the second graph gb may represent the cumulative cell count value ccc corresponding to the threshold voltage Vth.

The threshold voltage distribution shown in FIG. 8 represents a portion of the threshold voltage distribution in FIG. 6 and may represent the distributions of two adjacent threshold voltages. For example, FIG. 8 may show threshold voltage distributions corresponding to the first program state P1 and the second program state P2. In FIG. 8, the first program state P1 and the second program state P2 are shown for convenience of explanation, but this is only an example. The same or similar description as the first program state P1 and the second program state P2 may be applied to other states in the threshold voltage distributions. For example, the description of FIG. 8 may also be applied to the sixth program state P6 and the seventh program state P7 in the threshold voltage distribution of the TLC of FIG. 6. However, this is only an example and may represent two other adjacent states.

The sum distribution SD of a first graph ga may be the sum of the first program state p1 and the second program state p2. The sum distribution SD may be modeled as a probability density function, and a valley V of the sum distribution SD may be formed.

A second graph gb may represent the cumulative cell count value ccc corresponding to a plurality of read levels. The plurality of read levels may mean arbitrary threshold voltage levels in the threshold voltage distribution of the first program state p1 and the second program state p2. As an example, the plurality of read levels may be threshold voltages near the threshold voltage corresponding to the valley V. The plurality of read levels may be threshold voltages near a valley read level Vv corresponding to the valley V. For example, the second graph gb may represent the cumulative cell count value ccc corresponding to a first read level RL1 to a fourth read level RL4.

The cumulative cell count value ccc may be a value that sequentially accumulates the number of memory cells corresponding to each of a plurality of read levels. The cumulative cell count value ccc may be a value that sequentially accumulates the number of memory cells as the read level increases. As an example, the cumulative cell count value ccc corresponding to the first read level RL1 may be a first cumulative cell count value ccc1. The first cumulative cell count value ccc1 may be obtained by performing a counting operation (e.g., on cell or off cell counting) on read data read using the first read level RL1. For example, the first cumulative cell count value ccc1 may be the number of on cells counted using the first read level RL1. A second cumulative cell count value ccc2 may correspond to the second read level RL2 and may be obtained by performing a counting operation (e.g., on cell or off cell counting) on read data read using the second read level RL2. For example, the second cumulative cell count value ccc2 may be the number of on cells counted using the second read level RL2. The third cumulative cell count value ccc3 may correspond to the third read level RL3 and can be obtained by performing a counting operation (e.g., on cell or off cell counting) on read data read using the third read level RL3. For example, the third cumulative cell count value ccc3 may be the number of on cells counted using the third read level RL3. The fourth cumulative cell count value ccc4 may correspond to the fourth read level RL4 and may be obtained by performing a counting operation (e.g., on cell or off cell counting) on read data read using the fourth read level RL4. For example, the fourth cumulative cell count value ccc4 may be the number of on cells counted using the fourth read level RL4.

Figure 9:
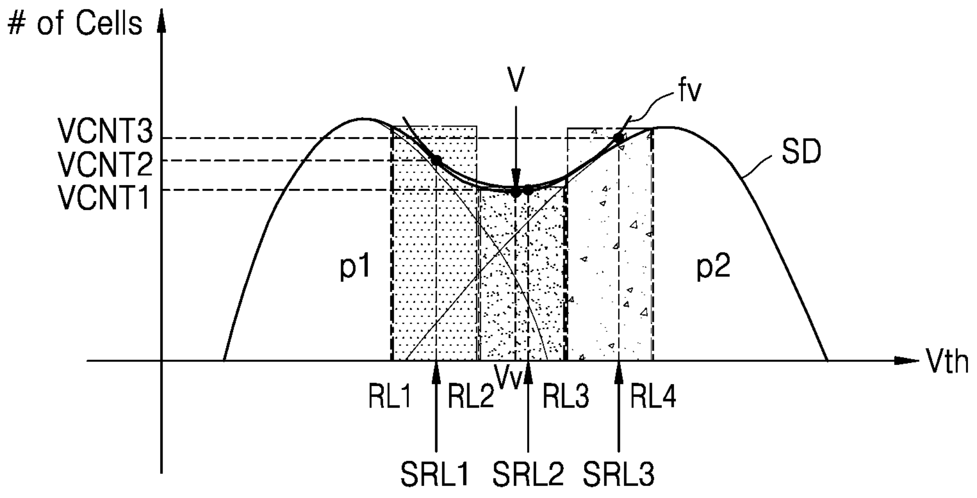
FIG. 9 is a diagram for explaining a method of generating a valley read level according to an embodiment.

FIG. 9 is a diagram for explaining a method of generating the valley read level according to an embodiment. In FIG. 9, the horizontal axis may represent the threshold voltage Vth of memory cells, and the vertical axis may represent the number # of cells of memory cells corresponding to the threshold voltage Vth. The descriptions already given in FIG. 8 are omitted.

In one embodiment, a plurality of read levels may be set through the valley search operation, and cumulative cell count values corresponding to the plurality of read levels may be obtained. As an example, the plurality of read levels may be preset and may be spaced apart from each other by a certain distance. In FIG. 9, the plurality of read levels are shown as four read levels, including the first read level RL1 to the fourth read level RL4, but is not necessarily limited thereto. Hereinafter, a case where the plurality of read levels are the first read level RL1 to the fourth read level RL4 is described.

Referring to FIGS. 8 and 9 together, a memory controller (e.g., the memory controller 110 of FIG. 1) may obtain the cumulative cell count value ccc corresponding to the plurality of read levels through the valley search operation. In detail, the valley search manager (e.g., valley search manager 112 in FIG. 1) may obtain first cumulative cell count value ccc1 to fourth cumulative cell count value ccc4 corresponding to the first read level RL1 to fourth read level RL4.

The memory controller may generate the valley read level Vv based on the cumulative cell count value ccc. The memory controller may generate a valley cell count value VCNT based on the cumulative cell count value ccc and generate the valley read level Vv based on the valley cell count value VCNT. In one embodiment, the valley cell count value VCNT may be the difference between the cumulative cell count value corresponding to a specific read level among the plurality of read levels and a cumulative cell count value corresponding to a read level adjacent to the specific read level.

For example, a first valley cell count value VCNT1 may be the difference between the first cumulative cell count value ccc1 corresponding to the first read level RL1 and the second cumulative cell count value ccc2 corresponding to the second read level RL2. The second read level RL2 may be adjacent to the first read level RL1, and the first valley cell count value VCNT1 may be a value obtained by subtracting the first cumulative cell count value ccc1 from the second cumulative cell count value ccc2. A second valley cell count value VCNT2 may be the difference between the second cumulative cell count value ccc2 corresponding to the second read level RL2 and the third cumulative cell count value ccc3 corresponding to the third read level RL3. The third read level RL3 may be adjacent to the second read level RL2, and the second valley cell count value VCNT2 may be a value obtained by subtracting the second cumulative cell count value ccc2 from the third cumulative cell count value ccc3. The third valley cell count value VCNT3 may be the difference between the third cumulative cell count value ccc3 corresponding to the third read level RL3 and the fourth cumulative cell count value ccc4 corresponding to the fourth read level RL4. The fourth read level RL4 may be adjacent to the third read level RL3, and the third valley cell count value VCNT3 may be a value obtained by subtracting the third cumulative cell count value ccc3 from the fourth cumulative cell count value ccc4.

The threshold voltage corresponding to each valley cell count value VCNT may be a value between two read levels used to generate the valley cell count value VCNT or one of the two read levels used to generate the valley cell count value VCNT. In one embodiment, the threshold voltage corresponding to each valley cell count value VCNT may be an intermediate value of the two read levels used to generate the valley cell count value VCNT. For example, the threshold voltage corresponding to the first valley cell count value VCNT1 may be a first sample read level SRL1, the threshold voltage corresponding to the second valley cell count value VCNT2 is a second sample read level SRL2, and the threshold voltage corresponding to the third valley cell count value VCNT3 may be a third sample read level SRL3.

The memory controller may derive the valley cell count value VCNT and a sample read level SRL corresponding to the valley cell count value VCNT using read points including a plurality of read levels of the sum distribution SD and the cumulative cell count values respectively corresponding to the plurality of read levels. The memory controller may model a memory cell count function fv based on the valley cell count value VCNT and the sample read level SRL corresponding to the valley cell count value VCNT and may generate the valley read level Vv based on the memory cell count function fv. As an example, the memory cell count function fv of a quadratic function may be generated that uses the first sample read level SRL1 to the third sample read level SRL3 as input and the first valley cell count value VCNT1 to the third valley cell count value VCNT3 as output. For example, the lowest point of the memory cell count function fv may be the valley V, and the threshold voltage corresponding to the valley V may be the valley read level Vv. However, the memory cell count function fv is not necessarily limited thereto, and the valley read level Vv may be generated through various methods.

Figure 10:
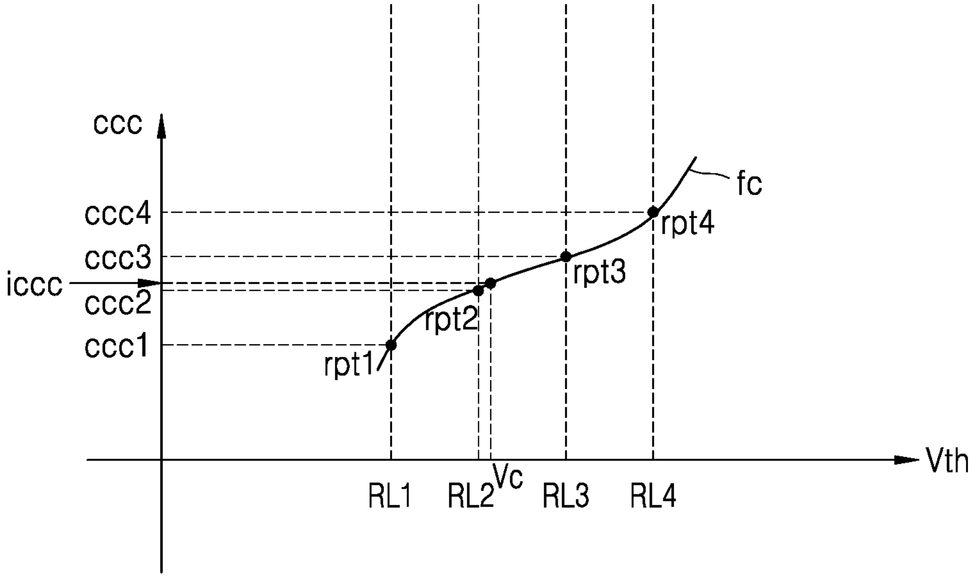
FIG. 10 is a diagram for explaining a method of generating a cumulative read level according to an embodiment.

FIG. 10 is a diagram for explaining a method of generating a cumulative read level according to an embodiment. In FIG. 10, the horizontal axis may represent the threshold voltage Vth of memory cells, and the vertical axis may represent the cumulative cell count value ccc corresponding to the threshold voltage Vth. The descriptions already given regarding the method of generating a cumulative read level in FIG. 10 are omitted.

A cumulative read level Vc may be generated based on a plurality of read levels RL and a cumulative cell count value ccc corresponding to the plurality of read levels RL. In detail, a read level generator (e.g., read level generator 113 in FIG. 1) may generate the cumulative read level Vc. In one embodiment, the plurality of read levels RL may be set through the valley search operation, and the memory controller may obtain a cumulative cell count value ccc corresponding to the plurality of read levels RL.

The memory controller may obtain first cumulative cell count value ccc1 to fourth cumulative cell count value ccc4 corresponding to the first read level RL1 to fourth read level RL4, respectively. That is, the memory controller may obtain a plurality of read points rpt. Because the cumulative read level Vc is generated using the cumulative cell count value ccc obtained through the valley search operation, the cumulative read level Vc may be calculated and cost may be reduced even without an additional configuration for obtaining the cumulative cell count value ccc.

The read point rpt may include a read level and a cumulative cell count value ccc corresponding to the read level. The memory controller may acquire a first read point rpt1, a second read point rpt2, a third read point rpt3, and a fourth read point rpt4. The first read point rpt1 may include the first read level RL1 and the first cumulative cell count value ccc1, the second read point rpt2 may include the second read level RL2 and the second cumulative cell count value ccc2, the third read point rpt3 may include the third read level RL3 and the third cumulative cell count value ccc3, and the fourth read point rpt4 may include the fourth read level RL4 and the fourth cumulative cell count value ccc4.

The memory controller may model a cumulative cell count function fc between threshold voltage distributions based on a plurality of read points rpt and may generate the cumulative read level Vc between threshold voltage distributions based on the modeled cumulative cell count function fc. The memory controller may model a cumulative cell count function fc that uses the plurality of read levels RL as input and cumulative cell count values ccc corresponding to the plurality of read levels RL as output. The cumulative cell count function fc may refer to a function representing sequentially accumulated values of the number of memory cells corresponding to threshold voltages.

The memory controller may model the cumulative cell count function fc based on at least four read levels and a cumulative cell count value ccc corresponding to each of the at least four read levels. In one embodiment, the memory controller may model the cumulative cell count function fc based on four read points rpt including four read levels RL and four cumulative cell count values ccc corresponding to each of the four read levels RL. The memory controller may model the cumulative cell count function fc of a cubic function based on the first read point rpt1 to the fourth read point rpt4.

In one embodiment, the memory controller may generate the cumulative read level Vc corresponding to an ideal cell count value iccc based on the cumulative cell count function fc. The memory controller may obtain an input that outputs the ideal cell count value iccc from the cumulative cell count function fc as the cumulative read level Vc. The ideal cell count value iccc may be a value obtained by dividing the number of memory cells included in the memory device equally into a plurality of states in the threshold voltage distribution. As an example, the ideal cell count value iccc may mean the number of memory cells included in one state when a plurality of memory cells included in one page are evenly divided into a plurality of states. Thus, the cumulative read level is a given read level configured to result in observing the ideal cell count value based on the plurality of memory cells holding data corresponding to the plurality of states associated with the threshold voltage distribution. For example, in TLC, the ideal cell count value iccc may mean the number of memory cells included in one state when the plurality of memory cells included in one page are evenly divided into eight states. The cumulative cell count function fc represents the effect of the memory cells holding random data, stored in the memory cells according to the eight states.

Figure 11:
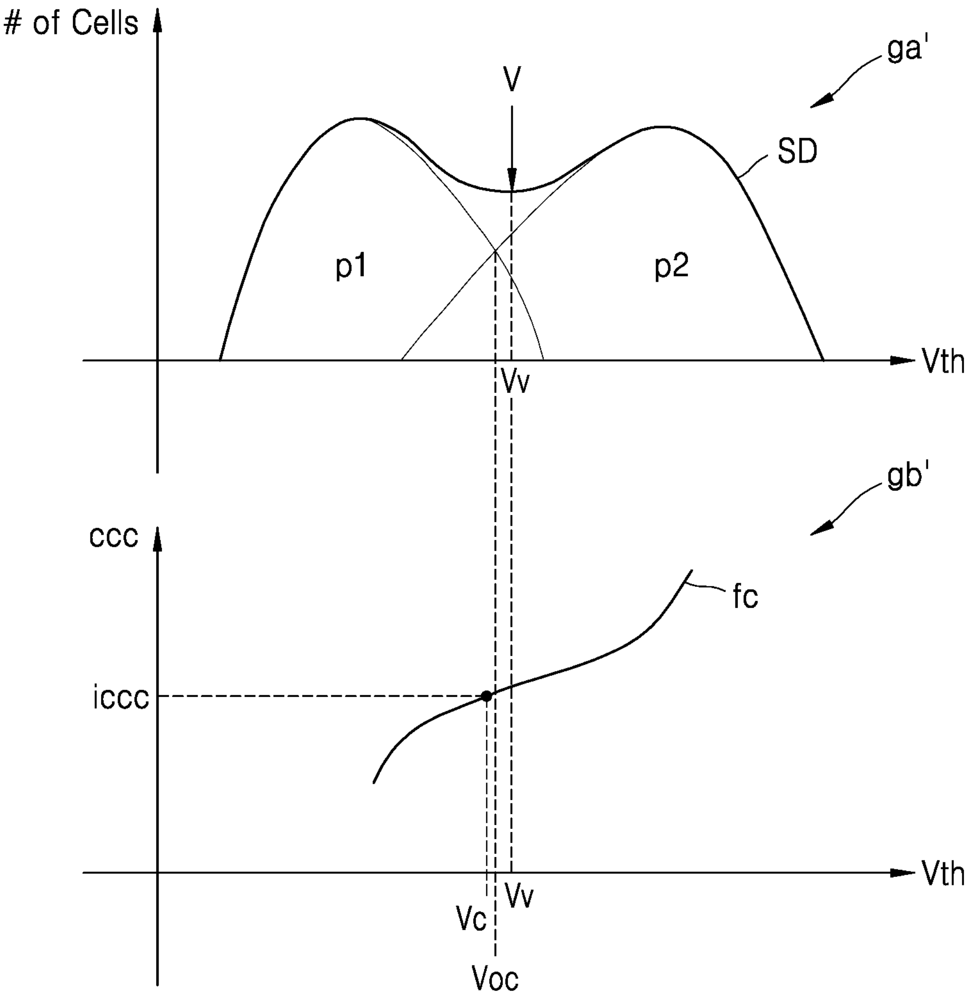
FIG. 11 is a diagram for explaining a method of generating an optimal read level according to an embodiment.

FIG. 11 is a diagram for explaining a method of generating an optimal read level according to an embodiment. The descriptions already given regarding the method of generating an optimal read level in FIG. 11 are omitted.

Referring to FIG. 11, a first graph ga' may represent the sum distribution SD of two adjacent threshold voltage distributions among the threshold voltage distributions. The horizontal axis of the first graph ga' may represent the threshold voltage Vth of the memory cells, and the vertical axis of the first graph ga' may represent the number # of cells of memory cells corresponding to the threshold voltage Vth. The first graph ga' represents the first program state p1, the second program state p2, and the sum distribution SD in which the first program state p1 is added to the second program state p2.

In FIG. 11, the first program state P1 and the second program state P2 are shown for convenience of explanation, but this is only an example. The same or similar description as the first program state P1 and the second program state P2 may be applied to other states in the threshold voltage distributions. For example, the first graph ga' may be two adjacent states among a plurality of states representing values stored in memory cells in the threshold voltage distribution. For example, in the TLC, the first state may be one of an erase state (e.g., erase state E in FIG. 6) and the first to sixth program state (e.g., P1 to P6 in FIG. 6), and the second state may be one of the first to seventh program states (e.g., P1 to P7 in FIG. 6) adjacent to the first state. However, this is just an example and may also be applied to other level cells (e.g., SLC, MLC, QLC, etc.).

The second graph gb' may represent the cumulative cell count function fc of two adjacent threshold voltage distributions among the threshold voltage distributions. The horizontal axis of the second graph gb' may represent the threshold voltage Vth of the memory cells, and the vertical axis of the second graph gb' may represent a cumulative cell count value ccc corresponding to the threshold voltage Vth.

A memory controller (e.g., memory controller 110 of FIG. 1) may generate an optimal read level Voc based on the cumulative read level Vc and the valley read level Vv. In detail, a read level generator (e.g., read level generator 113 in FIG. 1) may generate an optimal read level Voc. The optimal read level Voc may refer to the voltage level at which the smallest number of error bits occurs when performing the read operation among threshold voltage levels. As an example, the optimal read level Voc may be a threshold voltage corresponding to the point where the first program state p1 and the second program state p2 overlap.

The memory controller may generate the optimal read level Voc for each state in the threshold voltage distribution. For example, the memory controller may generate 7 optimal read levels for each state in the TLC. The memory controller may generate an optimal read level Voc between the erase state E and the first program state P1, an optimal read level Voc between the first program state P1 and the second program state P2, an optimal read level Voc between the second program state P2 and the third program state P3, an optimal read level Voc between the third program state P3 and the fourth program state P4, an optimal read level Voc between the fourth program state P4 and the fifth program state P5, an optimal read level Voc between the fifth program state P5 and the sixth program state P6, and an optimal read level Voc between the sixth program state P6 and the seventh program state P7.

Referring to FIG. 11, the optimal read level Voc may be a threshold voltage value between the cumulative read level Vc and the valley read level Vv. When the threshold voltage distribution of the first program state p1 and the second program state p2 is asymmetric, the optimal read level Voc may be a voltage value closer to either the valley read level Vv or the cumulative read level Vc. Accordingly, the optimal read level Voc may be derived by applying different weights to each of the valley read level Vv and the cumulative read level Vc.

The memory controller may generate an optimal read level Voc by applying a valley weight to the valley read level Vv and a cumulative weight to the cumulative read level Vc. The cumulative weights and the valley weights may be positive numbers. When the threshold voltage distribution of the first program state p1 and the second program state p2 is asymmetric, the optimal read level Voc may be a voltage value closer to the cumulative read level Vc than the valley read level Vv. In one embodiment, the cumulative weight may be greater than the valley weight.

The memory controller may generate the optimal read level Voc based on Equation 1 below.

$$Voc = Wv * Vv + Wc * Vc \quad \text{[Equation 1]}$$

"*" indicates multiplication, Voc may be the optimal read level, Wv may be the valley weight, Vv may be the valley read level, Wc may be the cumulative weight, and Vc may be the cumulative read level. The cumulative weight Wc may be greater than the valley weight Wv. The optimal read level Voc may be generated as a value closer to the cumulative read level Vc than a valley read level Vv.

In an embodiment, when the threshold voltage distribution of the first program state p1 is symmetrical to the threshold voltage distribution of the second program state p2, the valley read level Vv may be equal to the cumulative read level Vc, and the optimal read level Voc may be equal to the valley read level Vv.

By applying the valley weight Wv and the cumulative weight Wc greater than the valley weight Wv to the valley read level Vv and cumulative read level Vc, respectively, even if two adjacent states are asymmetrical in the threshold voltage distribution, the optimal read level Voc may be calculated to reduce errors in read data. Accordingly, the optimal read level Voc that reduces errors during the read operation may be calculated more accurately.

Figure 12:
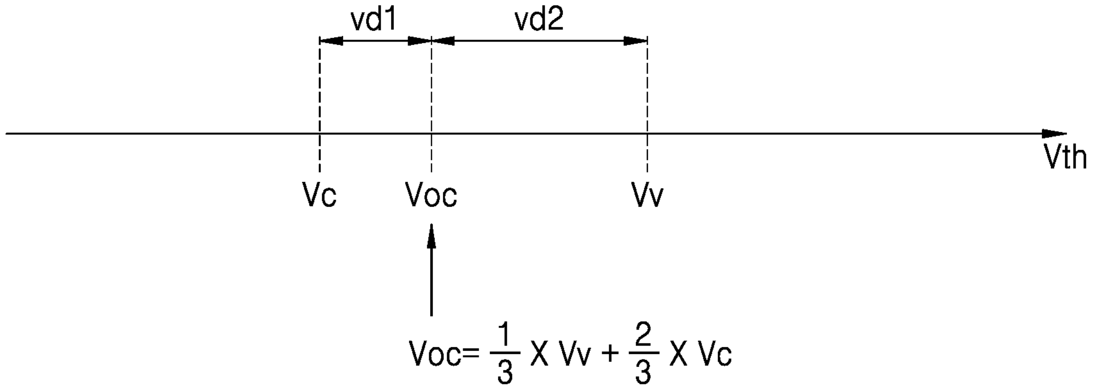
FIG. 12 is a diagram for explaining a cumulative weight and a valley weight according to an embodiment.

FIG. 12 is a diagram for explaining a cumulative weight and a valley weight according to an embodiment. In FIG. 12, the horizontal axis may represent the threshold voltage Vth of memory cells. FIG. 12 explains a case where the cumulative weight is twice the valley weight. The descriptions already given in FIG. 11 are omitted.

Referring to FIG. 12, an optimal read level Voc may be a threshold voltage value between a cumulative read level Vc and the valley read level Vv. When the threshold voltage distribution of the first state (e.g., the first program state p1 in FIG. 11) and the second state (e.g., the second program state p2 in FIG. 2) is asymmetric, the optimal read level Voc may be a voltage value closer to the cumulative read level Vc than the valley read level Vv. The difference between the cumulative read level Vc and the optimal read level Voc may be a first difference vd1. The difference between the valley read level Vv and the optimal read level Voc may be a second difference vd2. For example, the second difference vd2 may be twice the first difference vd1. The optimal read level Voc may correspond to a 1:2 split between the cumulative read level Vc and the valley read level Vv.

The memory controller may generate the optimal read level Voc by applying the valley weight to the valley read level Vv and the cumulative weight to the cumulative read level Vc. In one embodiment, the cumulative weight may be twice the valley weight. The memory controller may generate the optimal read level Voc based on Equation 2 below.

$$Voc = \frac{1}{3} X Vv + \frac{2}{3} X Vc \quad \text{[Equation 2]}$$

Here, Voc may be the optimal read level, Vv may be the valley read level, and Vc may be the cumulative read level. The cumulative weight may be ⅔, the valley weight may be ⅓, and the cumulative weight may be twice the valley weight. The optimal read level Voc may be generated as a value closer to the cumulative read level Vc than the valley read level Vv.

Figure 13:
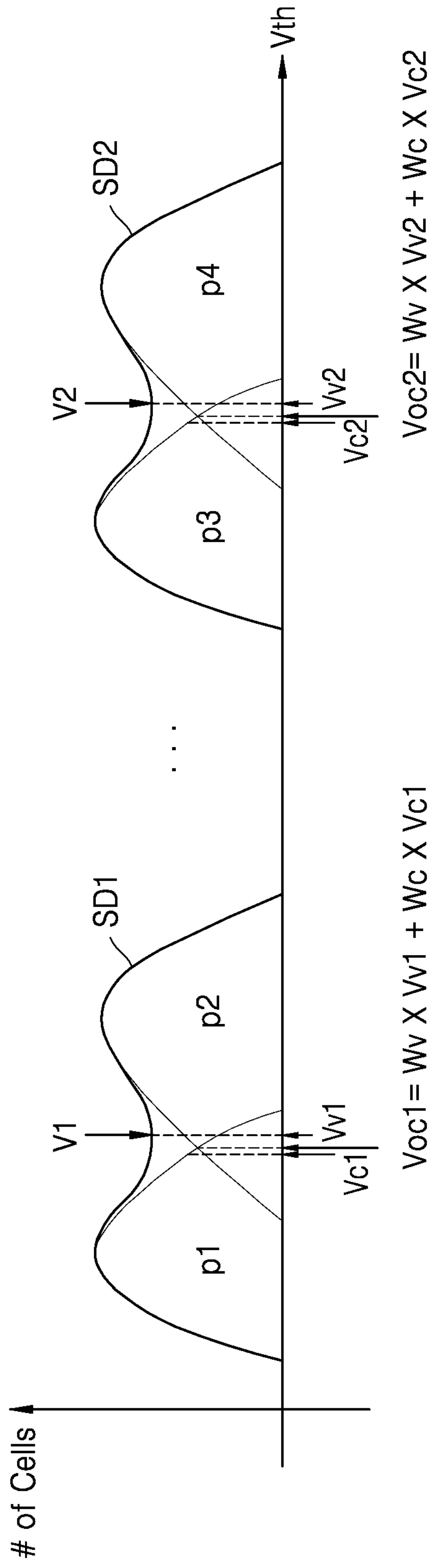
FIG. 13 is a diagram illustrating a method of generating an optimal read voltage corresponding to a plurality of states on a threshold voltage distribution according to an embodiment.

FIG. 13 is a diagram illustrating a method of generating an optimal read voltage corresponding to a plurality of states on a threshold voltage distribution according to an embodiment. The descriptions already given in FIG. 11 are omitted.

Referring to FIG. 13, the horizontal axis of FIG. 13 may represent the threshold voltage Vth of memory cells, and the vertical axis may represent the number # of cells of memory cells corresponding to the threshold voltage Vth. A first sum distribution SD1 represents the sum distribution of the first state and the second state. The first state and the second state may be adjacent to each other. A second sum distribution SD2 represents the sum distribution of the third state and the fourth state. The third state and the fourth state may be adjacent to each other. The first to fourth states may represent some of a plurality of states in the threshold voltage distribution. The third state is not adjacent to the first state and may have a higher threshold voltage level than the first state.

As an example, when the memory cell is the TLC, the first state and the second state correspond to the first program state P1 and the second program state P2, respectively, and the third state and the fourth state may correspond to the third program state P3 and the fourth program state P4, respectively. However, the plurality of states on a threshold voltage distribution are not necessarily limited thereto, and the first to fourth states may correspond to other states (for example, states E and P1 to P7 in FIG. 6). In addition, it may also correspond to states at other memory cell levels. In FIG. 13, for convenience of explanation, the first program state p1 to the fourth program state p4 are shown, but of course, the description of FIG. 13 may be applied in the same or similar manner to other states of the memory cell. Below, for convenience of explanation, the first program state p1 to the fourth program state p4 are described.

A memory controller (e.g., memory controller 110 of FIG. 1) may generate a first optimal read level Voc1. The first optimal read level Voc1 may be an optimal read level corresponding to the first program state p1. The optimal read level corresponding to the first program state p1 may mean the optimal read level between the first program state p1 and the second program state p2. As an example, the optimal read level corresponding to the first program state p1 may mean the optimal read level corresponding to the first sum distribution SD1 of the first program state p1 and the second program state p2. The memory controller may generate the first optimal read level Voc1 based on a first cumulative read level Vc1 and a first valley read level Vv1. The first valley read level Vv1 may be a valley read level corresponding to the first valley V1 in the first sum distribution SD1. The first cumulative read level Vc1 may be a cumulative read level derived based on the cumulative cell count function between the first program state p1 and the second program state p2.

The memory controller may generate a second optimal read level Voc2. The second optimal read level Voc2 may be an optimal read level corresponding to the third program state p3. The memory controller may generate the second optimal read level Voc2 based on a second cumulative read level Vc2 and a second valley read level Vv2. The second valley read level Vv2 may be a valley read level corresponding to the second valley V2 in the second sum distribution SD2. The second cumulative read level Vc2 may be a cumulative read level derived based on the cumulative cell count function between the third program state p3 and the fourth program state p4.

The memory controller may generate an optimal read level by applying valley weight Wv and cumulative weight Wc. The cumulative weight Wc may be greater than the valley weight Wv. In one embodiment, the memory controller may generate the first optimal read level Voc1 and the second optimal read level Voc2 by applying the same valley weight Wv and cumulative weight Wc. The memory controller may generate the first optimal read level Voc1 by applying the valley weight Wv to the first valley read level Vv1 and applying the cumulative weight Wc to the first cumulative read level Vc1. The memory controller may generate the second optimal read level Voc2 by applying a valley weight Wv to the second valley read level Vv2 and applying the cumulative weight Wc to the second cumulative read level Vc2. As an example, when the memory cell is the TLC, the optimal read level for each state in the threshold voltage distribution may be generated by applying the same valley weight Wv and cumulative weight Wc.

Figure 14A:
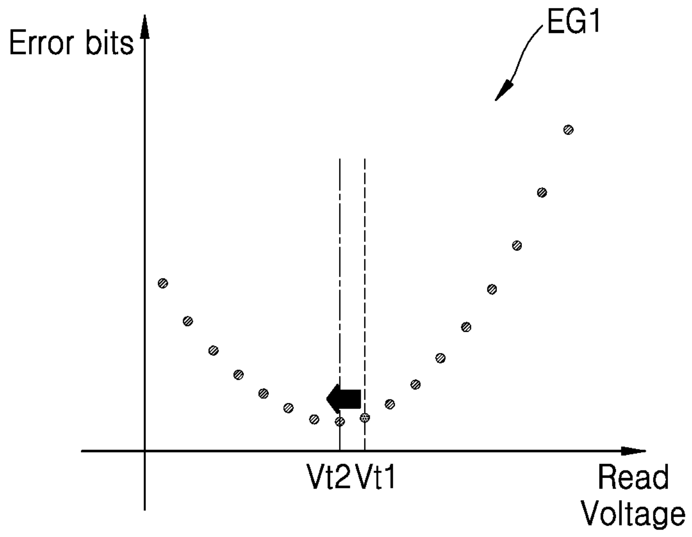
FIG. 14A is a diagram showing error bits for the distribution of threshold voltages of memory cells according to an embodiment.

FIG. 14A is a diagram showing error bits for the distribution of threshold voltages of memory cells according to an embodiment. The threshold voltage distribution for memory cells may be classified depending on the plurality of states as shown in FIG. 6, and a state corresponding to a relatively high threshold voltage may have a high error bit. Hereinafter, FIGS. 14A and 6 are referred to together, and descriptions already given in FIG. 6 may be omitted.

The horizontal axis of a first error graph EG1 may indicate a read level, and the vertical axis may indicate error bits. For convenience of explanation, in FIG. 14A, it is assumed that the memory cell is a TLC and the threshold voltage of the memory cell may be programmed into one of eight states E, RP1 to RP7. For example, the first error graph EG1 may represent the third program state P3.

The first error graph EG1 is a graph showing error bits resulting when a read voltage corresponding to the third program state P3 is applied to read the third program state P3 when memory cells are deteriorated. When the memory cells are deteriorated, the optimal read level for reading the third program state P3 may be the second voltage Vt2 and the valley read level found through the valley search operation may be the first voltage Vt1. That is, the optimal read level may not match the valley read level. In this case, the optimal read level may be calculated to be the second voltage Vt2 or a value close to the second voltage Vt2, based on the first voltage Vt1.

Figure 14B:
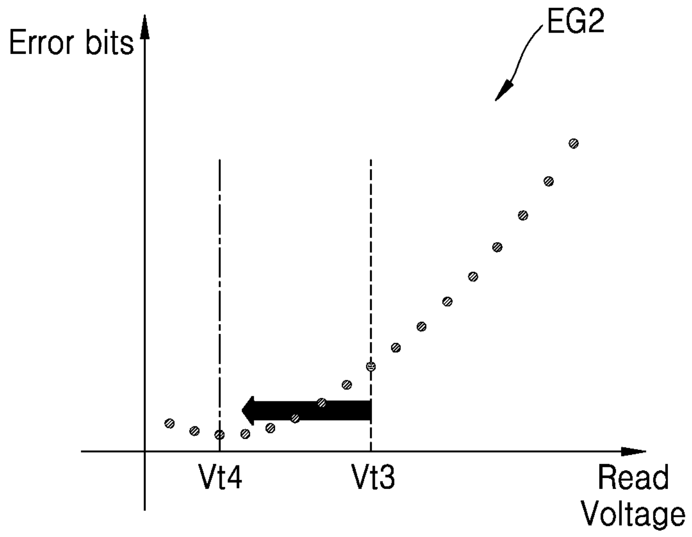
FIG. 14B is a diagram showing error bits for the distribution of threshold voltages of memory cells according to an embodiment.

FIG. 14B is a diagram showing error bits for the distribution of threshold voltages of memory cells according to an embodiment. The descriptions already given in FIG. 14A are omitted. Hereinafter, FIGS. 14A, 14B, and 6 are referred to together.

The horizontal axis of a second error graph EG2 may indicate the read level, and the vertical axis of the second error graph EG2 may indicate error bits. For example, the second error graph EG2 may represent the sixth program state P6.

The second error graph EG2 is a graph showing error bits resulting when a read voltage corresponding to the sixth program state P6 is applied to read the sixth program state P6 when memory cells are deteriorated. When the memory cells are deteriorated, the optimal read level for reading the sixth program state P6 may be a fourth voltage Vt4 and the valley read level found through the valley search operation may be a third voltage Vt3. That is, the optimal read level may not match the valley read level. In this case, the optimal read level may be calculated based on the third voltage Vt3 to be the fourth voltage Vt4 or a value close to the fourth voltage Vt4.

When the memory cells deteriorate, the difference between the valley read level corresponding to the third program state P3 and the optimal read level may be different from the difference between the valley read level corresponding to the sixth program state P6 and the optimal read level. The difference between the valley read level corresponding to the sixth program state P6 and the optimal read level may be greater than the difference between the valley read level corresponding to the third program state P3 and the optimal read level. As an example, the difference between the third voltage Vt3 and the fourth voltage Vt4 may be greater than the difference between the first voltage Vt1 and the second voltage Vt2. That is, in the state of the threshold voltage distribution corresponding to a relatively high threshold voltage, the error between the valley read level and the optimal read level may be relatively large.

When generating the optimal read level, cumulative weights and valley weights corresponding to each state in the threshold voltage distribution may be applied. The cumulative weight and valley weight may be different depending on the state of the threshold voltage distribution. Hereinafter, with reference to FIG. 15, a method in which valley weights and cumulative weights are applied differently depending on the state in the threshold voltage distribution is described.

Figure 15:
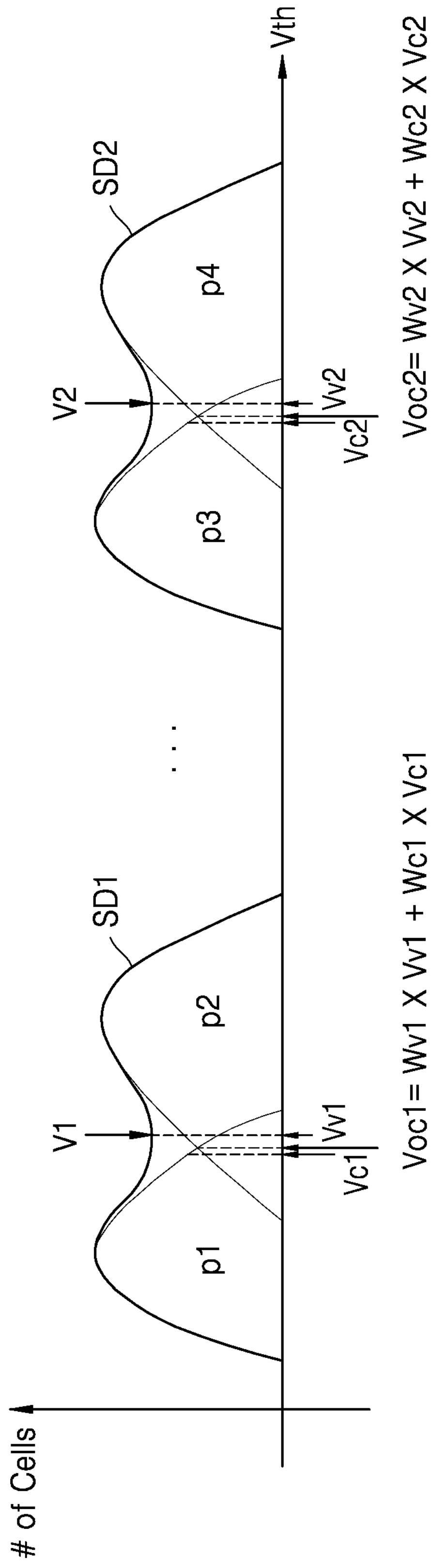
FIG. 15 is a diagram illustrating a method of generating an optimal read voltage corresponding to a plurality of states on a threshold voltage distribution according to an embodiment.

FIG. 15 is a diagram illustrating a method of generating an optimal read voltage corresponding to a plurality of states on a threshold voltage distribution according to an embodiment. Compared to FIG. 13, in FIG. 15, when generating an optimal read voltage corresponding to the state of the threshold voltage distribution, different cumulative weights may be applied depending on the state of the threshold voltage distribution. The descriptions already given in FIG. 13 are omitted.

The memory controller (e.g., memory controller 110 of FIG. 1) may generate the first optimal read level Voc1. The first optimal read level Voc1 may be an optimal read level corresponding to the first program state p1. The memory controller may generate the first optimal read level Voc1 based on the first cumulative read level Vc1 and the first valley read level Vv1. The first valley read level Vv1 may be a valley read level corresponding to the first valley V1 in the first sum distribution SD1. The first cumulative read level Vc1 may be a cumulative read level derived based on the cumulative cell count function between the first program state p1 and the second program state p2.

The memory controller may generate the first optimal read level Voc1 by applying the first valley weight Wv1 and a first cumulative weight Wc1. The memory controller may generate the first optimal read level Voc1 by applying a first valley weight Wv1 to the first valley read level Vv1 and applying the first cumulative weight Wc1 to the first cumulative read level Vc1. The first cumulative weight Wc1 may be greater than the first valley weight Wv1.

The memory controller may generate the second optimal read level Voc2. The second optimal read level Voc2 may be an optimal read level corresponding to the third program state p3. The memory controller may generate the second optimal read level Voc2 based on the second cumulative read level Vc2 and the second valley read level Vv2. The second valley read level Vv2 may be a valley read level corresponding to the second valley V2 in the second sum distribution SD2. The second cumulative read level Vc2 may be a cumulative read level derived based on the cumulative cell count function between the third program state p3 and the fourth program state p4.

The memory controller may generate the second optimal read level Voc2 by applying the second valley weight Wv2 and a second cumulative weight Wc2. The memory controller may generate the second optimal read level Voc2 by applying a second valley weight Wv2 to the second valley read level Vv2 and applying the second cumulative weight Wc2 to the second cumulative read level Vc2. The second cumulative weight Wc2 may be greater than the second valley weight Wv2. The second valley weight Wv2 may be different from the first valley weight Wv1, and the second cumulative weight Wc2 may be different from the first cumulative weight Wc1. In one embodiment, the first cumulative weight Wc1 may be less than the second cumulative weight Wc2

As an example, the optimal read level for each state in the threshold voltage distribution may be generated by applying different valley weight Wv and cumulative weight Wc. For example, when the memory cell is the TLC, the valley weights Wv and the cumulative weights Wc used when generating the optimal read level for each of the erase state (e.g., E in FIG. 6) and the first to sixth program states P1 to the sixth program state (e.g., P6 in FIG. 6) may be different from each other. However, the valley weights Wv and the cumulative weights Wc are not necessarily limited thereto, and the valley weight Wv and the cumulative weight Wc used when generating the optimal read level Voc for some states in the threshold voltage distribution may be the same. For example, the valley weight Wv and cumulative weight Wc used when generating the optimal read level for each of the first program state P1 and the second program state P2 may be the same. The valley weight Wv and cumulative weight Wc used when generating the optimal read level for each of the fifth program state (e.g., P5 in FIG. 6) and the sixth program state P6 may be the same. The valley weight Wv and cumulative weight Wc used when generating the optimal read level of the first program state P1 may be different from the valley weight Wv and cumulative weight Wc used when generating the optimal read level of the sixth program state P6.

The memory controller may generate the optimal read level by applying the cumulative weight and valley weight corresponding to each state in the threshold voltage distribution, so that in the state corresponding to the threshold voltage, an optimal read level that reflects the error between the valley read level and the optimal read level may be generated. Accordingly, the optimal read level that can reduce errors may be created.

Figure 16:
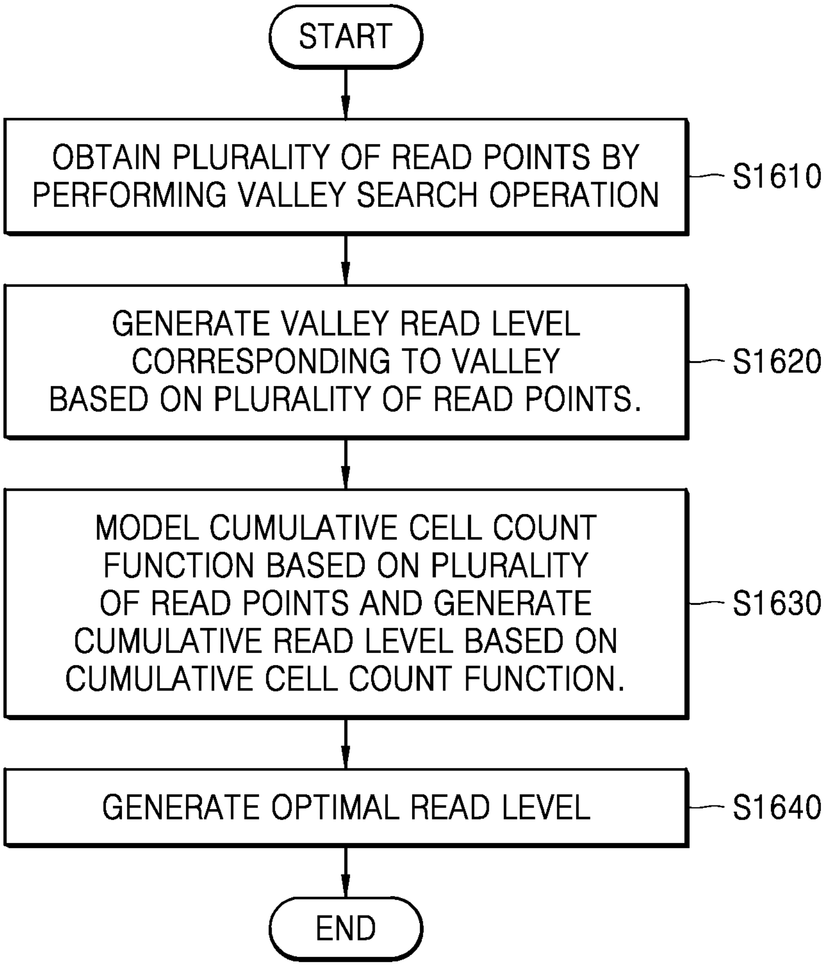
FIG. 16 is a flowchart for explaining a method of operating a memory controller according to an embodiment.

FIG. 16 is a flowchart for explaining a method of operating a memory controller according to an embodiment. In detail, FIG. 16 explains an operating method of the memory controller 110 of FIG. 1. The descriptions already given regarding the method of operating a memory controller in FIG. 16 are omitted.

In operation S1610, the memory controller may obtain a plurality of read points by performing a valley search operation. The valley search operation may be an operation that searches for valleys between threshold voltage distributions of memory cells included in the memory device. The valley search operation may be an operation of searching for a valley formed at a point where the threshold voltage distribution of the first state intersects the threshold voltage distribution of the second state adjacent to the first state among a plurality of states representing values stored in memory cells in the threshold voltage distribution. The plurality of read points may include a plurality of read levels and cumulative cell count values repectively corresponding to the plurality of read levels.

The cumulative cell count value may be a value that sequentially accumulates the number of memory cells corresponding to each of a plurality of read levels. The cumulative cell count value may be obtained by performing a counting operation (e.g., on cell or off cell counting) on read data read using a plurality of read levels through a valley search operation. As an example, the memory controller may obtain a plurality of read points from the memory device. However, the memory controller is not necessarily limited thereto, and the memory controller may obtain a plurality of read points through the valley search operation.

In operation S1620, the memory controller may generate a valley read level corresponding to the valley based on the plurality of read points. The memory controller may generate a valley read level through a valley search operation. A plurality of read levels may be set through a valley search operation, and cumulative cell count values corresponding to the plurality of read levels may be obtained. As an example, a plurality of read levels may be preset, and the plurality of read levels may be spaced apart from each other by a certain distance. For example, the memory controller may use at least four read points to generate a valley read level corresponding to one state in the threshold voltage distribution.

The memory controller may generate a valley read level based on the cumulative cell count value. The memory controller may model a memory cell count function based on the cumulative cell count value and generate a valley read level based on the memory cell count function. As an example, the memory controller may generate a memory cell count function of a quadratic function. For example, the lowest point of the memory cell count function may be the valley, and the threshold voltage corresponding to the valley may be the valley read level. However, the valley read level is not necessarily limited thereto, and the valley read level may be generated through various methods.

In operation S1630, the memory controller may model a cumulative cell count function between threshold voltage distributions based on a plurality of read points and may generate a cumulative read level based on a modeled cumulative cell count function. The memory controller may model a cumulative cell count function between threshold voltage distributions based on a plurality of read levels and cumulative cell count values repectively corresponding to the plurality of read levels.

The memory controller may model a cumulative cell count function that uses a plurality of read levels as input and outputs cumulative cell count values corresponding to the plurality of read levels. The cumulative cell count function may refer to a function representing sequentially accumulated values of the number of memory cells corresponding to threshold voltages.

The memory controller may model a cumulative cell count function based on at least four read levels and cumulative cell count values corresponding to each of the at least four read levels. In one embodiment, the memory controller may model a cumulative cell count function based on four read points including four read levels and four cumulative cell count values corresponding to each of the four read levels. As an example, the memory controller may model the cumulative cell count function as a cubic function based on the four read points.

The memory controller may generate a cumulative read level based on a modeled cumulative cell count function. In one embodiment, the memory controller may generate a cumulative read level corresponding to an ideal cell count value based on a cumulative cell count function. The memory controller may obtain an input that outputs an ideal cell count value from the cumulative cell count function as the cumulative read level. The ideal cell count value may be a value obtained by equally dividing the number of memory cells included in the memory device into a plurality of states in the threshold voltage distribution.

In operation S1640, the memory controller may generate an optimal read level based on the valley read level and cumulative read level. The memory controller may generate an optimal read level by applying a valley weight to the valley read level and a cumulative weight to the cumulative read level. In one embodiment, the valley weight and cumulative weight may be positive numbers, and the cumulative weight may be greater than the valley weight.

As an example, the memory controller may generate the optimal read level for each state in the threshold voltage distribution by applying the same valley weight and cumulative weight. The memory controller may generate a first optimal read level. The first optimal read level may be an optimal read level corresponding to the first state. The memory controller may generate a first optimal read level based on the first cumulative read level and the first valley read level. The memory controller may generate a second optimal read level. The second optimal read level may be an optimal read level corresponding to the second state. The memory controller may generate a second optimal read level based on the second cumulative read level and the second valley read level. The memory controller may generate the first optimal read level and the second optimal read level by applying the same valley weight and cumulative weight. The memory controller may generate a first optimal read level by applying a valley weight to the first valley read level and applying a cumulative weight to the first cumulative read level. The memory controller may generate the second optimal read level by applying the same valley weight as the valley weight applied when generating the first optimal read level to the second valley read level and applying the same cumulative weight as the cumulative weight applied when generating the first optimal read level to the second cumulative read level Vc2. As an example, when the memory cell is the TLC, the optimal read level for each state in the threshold voltage distribution may be generated by applying the same valley weight and cumulative weight.

As an example, the memory controller may generate an optimal read level by applying cumulative weights and valley weights corresponding to each state in the threshold voltage distribution. The memory controller may generate an optimal read level by applying different cumulative weights and valley weights depending on the state in the threshold voltage distribution.

The memory controller may generate a first optimal read level based on the first cumulative read level and the first valley read level. The memory controller may generate a first optimal read level by applying a first valley weight to the first valley read level and applying a first cumulative weight to the first cumulative read level. The first cumulative weight may be greater than the first valley weight. The memory controller may generate a second optimal read level by applying a second valley weight to the second valley read level and applying a second cumulative weight to the second cumulative read level. The second cumulative weight may be greater than the second valley weight. The second valley weight may be different from the first valley weight, and the second cumulative weight may be different from the first cumulative weight. In one embodiment, the first cumulative weight may be less than the second cumulative weight.

In an embodiment, the method of operating a memory controller, shown in FIG. 16 may further include performing an error correction operation on data read from the memory device before operation S1610. When the error correction operation for the read data fails, operations S1610 to S1640 may be performed.

Figure 17:
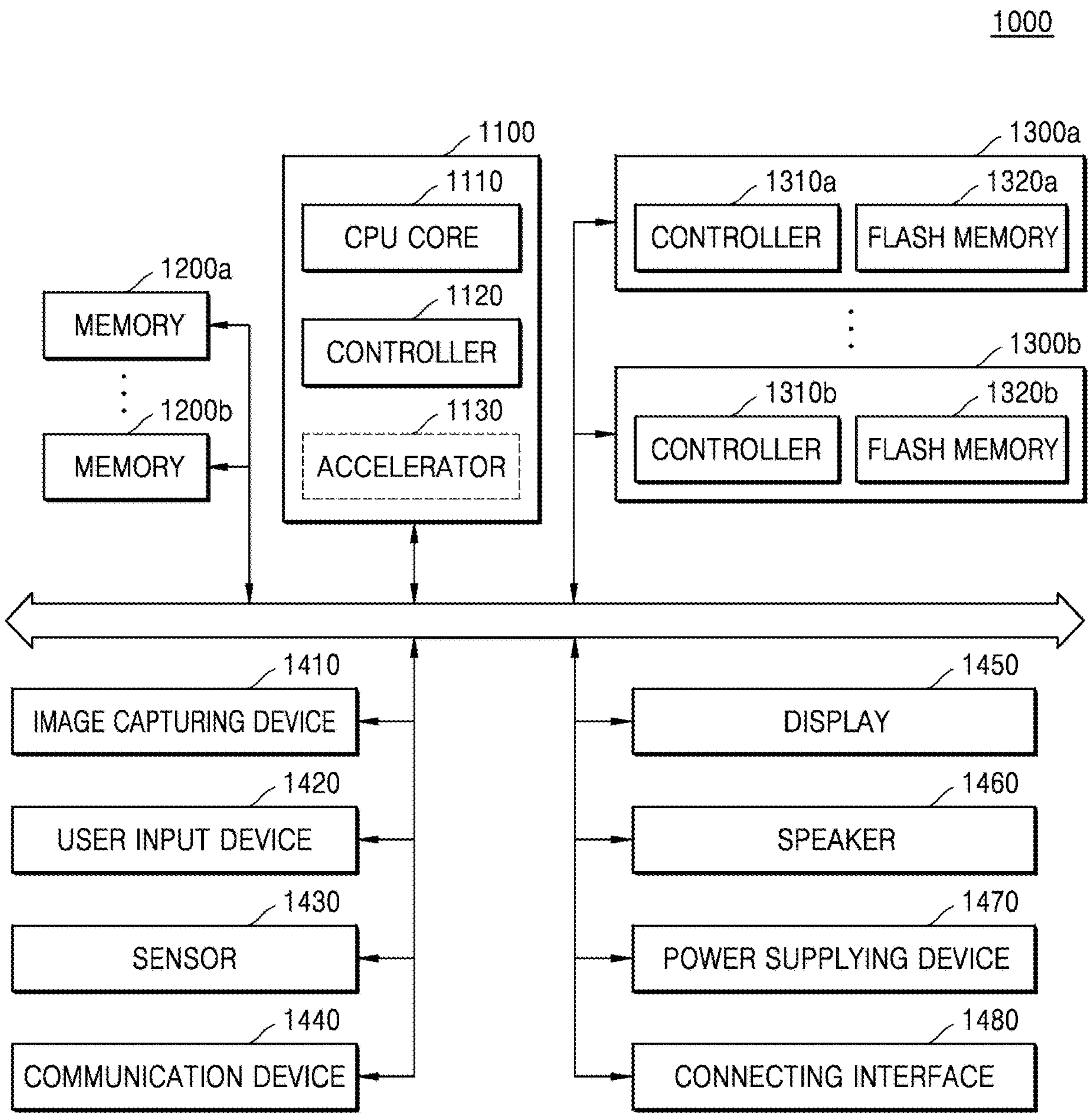
FIG. 17 shows a system to which a storage device according to an embodiment is applied.

FIG. 17 shows a system to which a storage device according to an embodiment is applied. The storage devices 1300*a* and 1300*b* of FIG. 17 may be the memory system described in the embodiments (for example, the memory system 100 of FIG. 1). The system 1000 of FIG. 17 may basically be a mobile system, such as mobile phones, smart phones, tablet personal computer (PC), wearable devices, healthcare devices, or internet of things (IoT) devices. However, the system 1000 of FIG. 17 is not necessarily limited to mobile systems and may be a personal computer, laptop computer, server, media player, or automotive device such as navigation.

Referring to FIG. 17, the system 1000 may include a main processor 1100, memories 1200*a* and 1200*b*, and storage devices 1300*a* and 1300*b* and may further include one or more of an image capturing device 1410, a user input device 1420, a sensor 1430, a communication device 1440, a display 1450, a speaker 1460, a power supplying device 1470, and a connecting interface 1480.

The main processor 1100 may control the overall operation of the system 1000, and more specifically, the operation of other components forming the system 1000. The main processor 1100 may be implemented as a general-purpose processor, a dedicated processor, or an application processor.

The main processor 1100 may include one or more CPU cores 1110 and may further include a controller 1120 for controlling the memories 1200*a* and 1200*b* and/or storage devices 1300*a* and 1300*b*. Depending on an embodiment, the main processor 1100 may further include an accelerator 1130, which is a dedicated circuit for high-speed data operations such as artificial intelligence (AI) data operations. Such an accelerator 1130 may include a graphics processing unit (GPU), a neural processing unit (NPU), and/or a data processing unit (DPU) and may be implemented as a separate chip that is physically independent from other components of the main processor 1100.

The memories 1200*a* and 1200*b* may be used as the main memory device of the system 1000 and may include volatile memory such as SRAM and/or DRAM, but may also include non-volatile memory such as flash memory, PRAM, and/or RRAM. The memories 1200_a_ and 1200_b_ may also be implemented in the same package as the main processor 1100.

The storage devices 1300_a_ and 1300_b_ may function as non-volatile storage devices that store data regardless of whether power is supplied and may have a relatively large storage capacity compared to the memories 1200_a_ and 1200_b_. The storage devices 1300_a_ and 1300_b_ may include memory controllers 1310_a_ and 1310_b_ and non-volatile memory (NVM) 1320_a_ and 1320_b_ that store data under the control by the memory controllers 1310_a_ and 1310_b_. The non-volatile memory devices 1320_a_ and 1320_b_ may include flash memory with a 2-dimensional (2D) structure or a 3-dimensional (3D) vertical NAND (V-NAND) structure, but may also include other types of non-volatile memory, such as PRAM and/or RRAM. The memory system described in FIGS. 1 to 16 (e.g., the memory system 100 of FIG. 1) may be applied to the storage devices 1300_a_ and 1300_b_ of FIG. 17.

The storage devices 1300_a_ and 1300_b_ may be included in the system 1000 in a state that is physically separate from the main processor 1100, or may be implemented in the same package as the main processor 1100. In addition, the storage devices 1300_a_ and 1300_b_ may have a form such as a solid state device (SSD) or a memory card, and may be detachably coupled to other components of the system through an interface such as a connection interface 1480, which is described below. Such storage devices 1300_a_ and 1300_b_ may be devices to which standard protocols, such as UFS, eMMC, or non-volatile memory express (NVMe) are applied, but are not necessarily limited thereto.

The image capturing device 1410 1410 may capture still images or moving images and may be a camera, camcorder, and/or webcam. The user input device 1420 may receive various types of data input from the user of the system 1000 and may be a touch pad, keypad, keyboard, mouse, and/or microphone, etc. The sensor 1430 may detect various types of physical quantities that can be obtained from outside the system 1000 and convert the sensed physical quantities into electrical signals. Such a sensor 1430 may be a temperature sensor, a pressure sensor, an illumination sensor, a position sensor, an acceleration sensor, a biosensor, and/or a gyroscope sensor.

The communication device 1440 may transmit and receive signals with other devices outside the system 1000 according to various communication protocols. Such a communication device 1440 may be implemented including an antenna, a transceiver, and/or a modem. The display 1450 and the speaker 1460 may function as output devices that output visual information and auditory information, respectively, to the user of the system 1000. The power supply device 1470 may appropriately convert power supplied from a battery built into the system 1000 and/or an external power source and supply the converted power to each component of the system 1000.

The connecting interface 1480 may provide a connection between the system 1000 and an external device that is connected to the system 1000 and may exchange data with the system 1000. The connecting interface 1480 may be implemented in various interface methods, such as ATA, SATA, e-SATA, SCSI, SAS, PCI, PCIe, NVMe, IEEE 1394, USB, SD card, multi-media card (MMC), eMMC, UFS, embedded universal flash storage (eUFS), and (CF card interface.

While example embodiments have been particularly shown and described, it will be understood that various changes in form and details may be made therein without departing from the spirit and scope of the following claims.

What is claimed is:

1. A memory controller configured to control a memory device comprising a plurality of memory cells, the memory controller comprising:

a valley search manager configured to perform a valley search operation to search for a valley between threshold voltage distributions associated with the plurality of memory cells and obtain a valley read level corresponding to the valley; and a read level generator configured to:

model a cumulative cell count function between the threshold voltage distributions based on a plurality of read levels, generate a cumulative read level between the threshold voltage distributions based on the cumulative cell count function, and generate an optimal read level by applying a valley weight to the valley read level and applying a cumulative weight to the cumulative read level.

2. The memory controller of claim 1, wherein the cumulative weight is greater than the valley weight, and the valley weight and the cumulative weight are positive numbers.

3. The memory controller of claim 2, wherein the cumulative weight is twice the valley weight.

4. The memory controller of claim 2, wherein the read level generator is further configured to:

generate a first optimal read level corresponding to a first state among a plurality of states representing values stored in the plurality of memory cells in the threshold voltage distributions, generate a second optimal read level corresponding to a second state having a higher threshold voltage level than a threshold voltage level of the first state, and generate the first optimal read level, which corresponds to the first state, and the second optimal read level, which corresponds to the second state, by applying the valley weight and the cumulative weight to the valley read level and the cumulative read level, respectively.

5. The memory controller of claim 2, wherein the read level generator is further configured to:

generate a first optimal read level corresponding to a first state among a plurality of states representing values stored in the plurality of memory cells, generate a second optimal read level corresponding to a second state having a higher threshold voltage level than the first state, apply a first valley weight and a first cumulative weight to the valley read level and the cumulative read level, respectively, to generate the first optimal read level corresponding to the first state, and apply a second valley weight and a second cumulative weight to the valley read level and the cumulative read level, respectively, to generate the second optimal read level corresponding to the second state, wherein the second valley weight is different from the first valley weight, and wherein the second cumulative weight is different from the first cumulative weight.

6. The memory controller of claim 5, wherein the first cumulative weight applied to the first optimal read level is smaller than the second cumulative weight applied to the second optimal read level.

7. The memory controller of claim 1, wherein the read level generator is further configured to generate the cumulative read level corresponding to an ideal cell count value based on the cumulative cell count function, and wherein the ideal cell count value is obtained based on equally dividing a number of the plurality of memory cells included in the memory device into a plurality of states representing values stored in the plurality of memory cells.

8. The memory controller of claim 1, wherein the read level generator is further configured to model the cumulative cell count function as a cubic function, based on at least four read levels and at least four cumulative cell count values respectively corresponding to the at least four read levels.

9. The memory controller of claim 1, wherein, based on a first threshold voltage distribution and a second threshold voltage distribution respectively corresponding to two adjacent states being symmetrical to each other, the optimal read level is equal to the valley read level, and wherein the two adjacent states are among a plurality of states respectively representing values stored in the plurality of memory cells.

10. The memory controller of claim 1, wherein the valley search manager is further configured to:

obtain cumulative cell count values respectively corresponding to the plurality of read levels through the valley search operation, and generate the valley read level based on the cumulative cell count values.

11. The memory controller of claim 1, wherein the valley search manager is further configured to generate the valley read level based on a valley cell count value, and wherein the valley cell count value is a difference between a first cumulative cell count value corresponding to a first read level among the plurality of read levels and a second cumulative cell count value corresponding to a second read level adjacent to the first read level.

12. A method of operating a memory controller, the method comprising:

performing a valley search operation that searches for a valley between threshold voltage distributions associated with a plurality of memory cells to obtain a plurality of read points comprising a plurality of read levels and cumulative cell count values respectively corresponding to the plurality of read levels;

generating a valley read level corresponding to the valley based on the plurality of read points;

modeling a cumulative cell count function between the threshold voltage distributions based on the plurality of read points and generating a cumulative read level between the threshold voltage distributions based on the cumulative cell count function; and generating an optimal read level by applying a valley weight to the valley read level and applying a cumulative weight to the cumulative read level.

13. The method of claim 12, wherein the valley weight and the cumulative weight are positive numbers, and the cumulative weight is greater than the valley weight.

14. The method of claim 12, wherein the generating of the optimal read level comprises:

applying a first valley weight and a first cumulative weight to the valley read level and the cumulative read level, respectively to generate a first optimal read level corresponding to a first state among a plurality of states representing values stored in the plurality of memory cells in the threshold voltage distributions; and applying a second valley weight different from the first valley weight and a second cumulative weight different from the first cumulative weight, to the valley read level and the cumulative read level, respectively to generate a second optimal read level corresponding to a second state having a higher threshold voltage level than a threshold voltage level of the first state.

15. The method of claim 12, wherein the generating of the optimal read level comprises:

applying a first valley weight and a first cumulative weight to generate a first optimal read level corresponding to a first state among a plurality of states representing values stored in the plurality of memory cells; and generating a second optimal read level corresponding to a second state having a higher threshold voltage level than a threshold voltage level of the first state by applying a second valley weight and a second cumulative weight to the valley read level and the cumulative read level, respectively, and wherein the first valley weight is the same as the second valley weight, and the first cumulative weight is the same as the second cumulative weight.

16. The method of claim 12, wherein the generating of the cumulative read level further comprises:

modeling the cumulative cell count function as a cubic function based on the plurality of read points; and generating the cumulative read level corresponding to an ideal cell count value based on the cumulative cell count function.

17. The method of claim 12, wherein the plurality of read points comprises four read points corresponding to four read levels and four cumulative cell count values corresponding to each of the four read levels, and wherein the modeling of the cumulative cell count function comprises modeling the cumulative cell count function using the four read points.

18. The method of claim 12, further comprising:

performing an error correction operation on given data read from a memory device, and wherein, based on the error correction operation for the given data failing, the generating of the optimal read level is performed.

19. A memory system comprising:

a memory device; and a memory controller, wherein the memory device is configured to, during a valley search operation that searches for a valley between threshold voltage distributions associated with a plurality of memory cells, generate cumulative cell count values respectively corresponding to a plurality of read levels, and wherein the memory controller is configured to:

receive the cumulative cell count values and generate a valley read level corresponding to the valley based on the cumulative cell count values, model a cumulative cell count function that takes the plurality of read levels as input and outputs the cumulative cell count values respectively corresponding to the plurality of read levels, generate a cumulative read level based on the cumulative cell count function, and generate an optimal read level by applying a valley weight to the valley read level and applying a cumulative weight to the cumulative read level.

20. The memory system of claim 19, wherein the memory controller is further configured to generate the optimal read level based on Equation 1 below, $$Voc = Wv * Vv + Wc * Vc, \quad \text{[Equation 1]}$$

wherein Voc is the optimal read level, Wv is the valley weight, Vv is the valley read level, Wc is the cumulative weight, Vc is the cumulative read level, and Wv and Wc are positive numbers, and wherein the valley weight Wv is less than the cumulative weight Wc.

* * * * *